(12) United States Patent
Agon

(10) Patent No.: US 11,056,784 B1
(45) Date of Patent: Jul. 6, 2021

(54) PHASED ARRAY ANTENNA WITH ANALOG BEAMFORMING—CALIBRATION TECHNIQUES FOR ANGLE OF ARRIVAL APPLICATIONS

(71) Applicant: Apple Inc., Cupertino, CA (US)

(72) Inventor: Zohar Agon, Tel Aviv (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/524,229

(22) Filed: Jul. 29, 2019

(51) Int. Cl.
*H01Q 3/26* (2006.01)
*H04B 17/13* (2015.01)
*G01R 29/10* (2006.01)

(52) U.S. Cl.
CPC ............. *H01Q 3/267* (2013.01); *G01R 29/10* (2013.01); *H04B 17/13* (2015.01)

(58) Field of Classification Search
CPC ......... H01Q 3/267; H04B 17/13; G01R 29/10
USPC ...................................................... 455/67.16
See application file for complete search history.

(56) References Cited

U.S. PATENT DOCUMENTS

| | | | |
|---|---|---|---|
| 6,411,257 B1 | 6/2002 | Sorelius | |
| 6,963,742 B2 | 11/2005 | Boros | |
| 7,427,953 B2 | 9/2008 | Chiang | |
| 8,125,388 B2 | 2/2012 | Kennedy | |
| 8,674,880 B2 | 3/2014 | Lecca | |
| 8,754,810 B2 | 6/2014 | Guo | |
| 8,988,277 B2 | 3/2015 | Leise | |
| 10,306,413 B2 | 5/2019 | Amizur | |
| 2016/0345286 A1 | 11/2016 | Jamieson | |
| 2018/0084371 A1* | 3/2018 | Scagnol | H04W 4/80 |

FOREIGN PATENT DOCUMENTS

WO    WO 2018/106260 A1    6/2018

* cited by examiner

*Primary Examiner* — Lee Nguyen
(74) *Attorney, Agent, or Firm* — Kowert, Hood, Munyon, Rankin & Goetzel, P.C.

(57) ABSTRACT

Embodiments are presented herein of apparatuses, systems, and methods for a wireless device to calibrate a phased antenna array. The wireless device may begin a calibration process with a second wireless device. The first wireless device may receive a calibration signal from the second wireless device and may calibrate a subset (e.g., all but one) of the antennas of the array. The first wireless device may receive a subsequent signal and estimate the angle of arrival using the calibrated subset of antennas. Further, the first wireless device may calibrate a complete set of antennas using calibration signals from a plurality of directions.

20 Claims, 20 Drawing Sheets

LO Beamforming

Digital Beamforming $$\underline{y} = \begin{pmatrix} 1 & 1 \\ 1 & -1 \end{pmatrix} \begin{pmatrix} a \\ a \cdot e^{j \cdot 2\pi \cdot d \cdot \sin\theta / \lambda} \end{pmatrix}$$

*FIG. 13*

$$\underline{y_0} = \underbrace{\begin{pmatrix} 1 & 1 & 1 & 1 \\ 1 & -e^{j\varphi_1} & -e^{j\varphi_2} & -e^{j\varphi_3} \\ 1 & 1 & -e^{j\varphi_2} & -e^{j\varphi_3} \\ 1 & -e^{j\varphi_1} & -e^{j\varphi_2} & 1 \end{pmatrix}}_{1401} \underbrace{\begin{pmatrix} \alpha_0 & 0 & 0 & 0 \\ 0 & \alpha_1 & 0 & 0 \\ 0 & 0 & \alpha_2 & 0 \\ 0 & 0 & 0 & \alpha_3 \end{pmatrix}}_{1402} \underbrace{\begin{pmatrix} a \\ a \cdot e^{j \cdot 2\pi \cdot d \cdot \sin\theta_0 / \lambda} \\ a \cdot e^{j \cdot 4\pi \cdot d \cdot \sin\theta_0 / \lambda} \\ a \cdot e^{j \cdot 6\pi \cdot d \cdot \sin\theta_0 / \lambda} \end{pmatrix}}_{\underline{a}(\theta_0) \atop 1403}$$

*FIG. 14*

$$H_d^{-1} \cdot \underline{y}_0 = \begin{pmatrix} 4\alpha_0 & 2\alpha_1(1-e^{j\varphi_1}) & 2\alpha_2(1-e^{j\varphi_2}) & 2\alpha_3(1-e^{j\varphi_3}) \\ 0 & 2\alpha_1(1+e^{j\varphi_1}) & 0 & 0 \\ 0 & 0 & 2\alpha_2(1+e^{j\varphi_2}) & 0 \\ 0 & 0 & 0 & 2\alpha_3(1+e^{j\varphi_3}) \end{pmatrix} \underbrace{}_{\underline{a}(\theta_0)}$$

$$= \begin{pmatrix} 1 \\ e^{j \cdot 2\pi \frac{d}{\lambda} \sin\theta_0} \\ e^{j \cdot 4\pi \frac{d}{\lambda} \sin\theta_0} \\ e^{j \cdot 6\pi \frac{d}{\lambda} \sin\theta_0} \end{pmatrix}$$

1502

$$\overbrace{\begin{pmatrix} 4\alpha_0 \\ 2\alpha_1(1-e^{j\varphi_1}) \\ 2\alpha_2(1-e^{j\varphi_2}) \\ 2\alpha_3(1-e^{j\varphi_3}) \\ 2\alpha_1(1+e^{j\varphi_1}) \\ 2\alpha_2(1+e^{j\varphi_2}) \\ 2\alpha_3(1+e^{j\varphi_3}) \end{pmatrix}}^{a}$$

$$\underline{y'_0} \triangleq \frac{H_d^{-1} \cdot \underline{y_0}}{2\alpha_1(1+e^{j\varphi_1}) \cdot a \cdot e^{j \cdot 2\pi \frac{d}{\lambda} \sin\theta_0}} \quad \sim 1602$$

$$= \frac{1}{2\alpha_1(1+e^{j\varphi_1}) \cdot a \cdot e^{j \cdot 2\pi \frac{d}{\lambda} \sin\theta_0}}$$

$$\begin{pmatrix} 4\alpha_0 & 2\alpha_1(1-e^{j\varphi_1}) & 2\alpha_2(1-e^{j\varphi_2}) & 2\alpha_3(1-e^{j\varphi_3}) & 2\alpha_4(1-e^{j\varphi_4}) & \cdots & 2\alpha_7(1-e^{j\varphi_7}) \\ 0 & 2\alpha_1(1+e^{j\varphi_1}) & 2\alpha_2(1+e^{j\varphi_2}) & 2\alpha_3(1+e^{j\varphi_3}) & 2\alpha_4(1+e^{j\varphi_4}) & & \\ 0 & 0 & 2\alpha_2(1+e^{j\varphi_2}) & 2\alpha_3(1+e^{j\varphi_3}) & 2\alpha_4(1+e^{j\varphi_4}) & & 0 \\ 0 & 0 & 0 & 2\alpha_3(1+e^{j\varphi_3}) & 2\alpha_4(1+e^{j\varphi_4}) & & 0 \\ 0 & 0 & 0 & 0 & 2\alpha_4(1+e^{j\varphi_4}) & & 0 \\ 0 & 0 & 0 & 0 & 0 & & 0 \\ 0 & 0 & 0 & 0 & 0 & & 0 \\ 0 & 0 & 0 & 0 & 0 & & 2\alpha_7(1+e^{j\varphi_7}) \end{pmatrix}$$ ~1604

$$\cdot \begin{pmatrix} a \\ a \cdot e^{j \cdot 2\pi \frac{d}{\lambda}\sin\theta_0} \\ a \cdot e^{j \cdot 4\pi \frac{d}{\lambda}\sin\theta_0} \\ a \cdot e^{j \cdot 6\pi \frac{d}{\lambda}\sin\theta_0} \\ a \cdot e^{j \cdot 8\pi \frac{d}{\lambda}\sin\theta_0} \\ a \cdot e^{j \cdot 10\pi \frac{d}{\lambda}\sin\theta_0} \\ a \cdot e^{j \cdot 12\pi \frac{d}{\lambda}\sin\theta_0} \\ a \cdot e^{j \cdot 14\pi \frac{d}{\lambda}\sin\theta_0} \end{pmatrix}$$

FIG. 16

$$\underline{y_0}'(1:7) = \underbrace{\begin{pmatrix} 1 & 0 & & 0 \\ 0 & e^{j \cdot 2\pi \cdot \frac{d}{\lambda} \sin\theta_0} & & 0 \\ 0 & 0 & & 0 \\ 0 & 0 & \cdots & 0 \\ 0 & 0 & & 0 \\ 0 & 0 & & 0 \\ 0 & 0 & & e^{j \cdot 14\pi \cdot \frac{d}{\lambda} \sin\theta_0} \end{pmatrix}}_{\underline{\underline{A_0}} \atop 1702} \cdot \underbrace{\begin{pmatrix} 1 \\ \frac{\alpha_2(1+e^{j\varphi_2})}{\alpha_1(1+e^{j\varphi_1})} \\ \frac{\alpha_3(1+e^{j\varphi_3})}{\alpha_1(1+e^{j\varphi_1})} \\ \frac{\alpha_4(1+e^{j\varphi_4})}{\alpha_1(1+e^{j\varphi_1})} \\ \frac{\alpha_5(1+e^{j\varphi_5})}{\alpha_1(1+e^{j\varphi_1})} \\ \frac{\alpha_6(1+e^{j\varphi_6})}{\alpha_1(1+e^{j\varphi_1})} \\ \frac{\alpha_7(1+e^{j\varphi_7})}{\alpha_1(1+e^{j\varphi_1})} \end{pmatrix}}_{\triangleq \underline{\alpha}}$$

FIG. 17

$$(diag\{\underline{\hat{\alpha}}\})^{-1}$$

FIG. 18

$$\underline{\hat{\alpha}} = \underline{\underline{A_0}}^{-1} \underline{y_0}'(1:7)$$

FIG. 19

$$\begin{pmatrix} \underline{y}'_0(0) \\ \cdot \\ \cdot \\ \underline{y}'_{K-1}(0) \end{pmatrix} = \begin{pmatrix} e^{-j \cdot 2\pi \frac{d}{\lambda} \sin\theta_0} & \cdot & 1 & e^{j \cdot 2\pi \frac{d}{\lambda} \sin\theta_0} & \cdots & e^{j(M-2)2\pi \frac{d}{\lambda} \sin\theta_0} \\ \cdot & & & & & \vdots \\ e^{-j \cdot 2\pi \frac{d}{\lambda} \sin\theta_{K-1}} & \cdot & 1 & e^{j \cdot 2\pi \frac{d}{\lambda} \sin\theta_{K-1}} & \cdots & e^{j(M-2)2\pi \frac{d}{\lambda} \sin\theta_{K-1}} \end{pmatrix}_{\triangleq \underline{\underline{B}}} \cdot \begin{pmatrix} 2\alpha_0 \\ \hline \alpha_1(1 + e^{j\varphi_1}) \\ \alpha_1(1 - e^{j\varphi_1}) \\ \hline \alpha_1(1 + e^{j\varphi_1}) \\ \alpha_2(1 - e^{j\varphi_2}) \\ \hline \alpha_1(1 + e^{j\varphi_1}) \\ \alpha_3(1 - e^{j\varphi_3}) \\ \hline \cdot \\ \cdot \\ \hline \alpha_{M-1}(1 - e^{j\varphi_{M-1}}) \\ \alpha_1(1 + e^{j\varphi_1}) \end{pmatrix}_{\triangleq \underline{\alpha}'}$$

$$= \underline{\underline{B}} \cdot \underline{\alpha}'$$

FIG. 23

$$\underbrace{\begin{pmatrix} \underline{y}'_0(0) - e^{-j \cdot 2\pi \cdot \frac{d}{\lambda} \sin\theta_0} \\ \cdot \\ \cdot \\ \underline{y}'_{K-1}(0) - e^{-j \cdot 2\pi \cdot \frac{d}{\lambda} \sin\theta_{K-1}} \end{pmatrix}}_{\underline{y}''}$$

$$= \underbrace{\begin{pmatrix} e^{-j \cdot 2\pi \cdot \frac{d}{\lambda} \sin\theta_0} & 1 & e^{-j \cdot 2\pi \cdot \frac{d}{\lambda} \sin\theta_0} & & e^{-j(M-2)2\pi \cdot \frac{d}{\lambda} \sin\theta_0} \\ \cdot & \cdot & \cdot & \cdots & \cdot \\ \cdot & \cdot & \cdot & & \cdot \\ e^{-j \cdot 2\pi \cdot \frac{d}{\lambda} \sin\theta_{K-1}} & 1 & e^{-j \cdot 2\pi \cdot \frac{d}{\lambda} \sin\theta_{K-1}} & & e^{-j(M-2)2\pi \cdot \frac{d}{\lambda} \sin\theta_{K-1}} \end{pmatrix}}_{\triangleq \underline{\underline{B}}}$$

$$\cdot \underbrace{\begin{pmatrix} \dfrac{2\alpha_0}{\alpha_1(1 + e^{j\varphi_1})} - 1 \\ \dfrac{\alpha_1(1 - e^{j\varphi_1})}{\alpha_1(1 + e^{j\varphi_1})} \\ \dfrac{\alpha_2(1 - e^{j\varphi_2})}{\alpha_1(1 + e^{j\varphi_1})} \\ \dfrac{\alpha_3(1 - e^{j\varphi_3})}{\alpha_1(1 + e^{j\varphi_1})} \\ \cdot \\ \cdot \\ \dfrac{\alpha_{M-1}(1 - e^{j\varphi_{M-1}})}{\alpha_1(1 + e^{j\varphi_1})} \end{pmatrix}}_{\triangleq \underline{\alpha}''}$$

FIG. 24

$$\underline{\alpha}'' \approx \underline{\underline{B}}^+ \underline{y}''$$

FIG. 25

$$\begin{pmatrix} \dfrac{2\alpha_0}{\alpha_1(1+e^{j\varphi_1})} & \dfrac{\alpha_1(1-e^{j\varphi_1})}{\alpha_1(1+e^{j\varphi_1})} & \dfrac{\alpha_1(1-e^{j\varphi_2})}{\alpha_1(1+e^{j\varphi_1})} & \dfrac{\alpha_3(1-e^{j\varphi_3})}{\alpha_1(1+e^{j\varphi_1})} & \cdots & \dfrac{\alpha_{M-1}(1-e^{j\varphi_{M-1}})}{\alpha_1(1+e^{j\varphi_1})} \\ 0 & 1 & \dfrac{\alpha_2(1+e^{j\varphi_2})}{\alpha_1(1+e^{j\varphi_1})} & \dfrac{\alpha_3(1+e^{j\varphi_3})}{\alpha_1(1+e^{j\varphi_1})} & \cdots & 0 \\ 0 & 0 & 0 & 0 & \cdots & 0 \\ 0 & 0 & 0 & 0 & \cdots & 0 \\ \cdot & \cdot & \cdot & \cdot & & \cdot \\ 0 & 0 & 0 & 0 & \cdots & 0 \\ 0 & 0 & 0 & 0 & \cdots & 0 \\ 0 & 0 & 0 & 0 & \cdots & \dfrac{\alpha_{M-1}(1-e^{j\varphi_{M-1}})}{\alpha_1(1+e^{j\varphi_1})} \end{pmatrix}^{-1}$$

FIG. 26

$$\frac{\alpha_2(1+e^{j\varphi_2})}{\alpha_1(1+e^{j\varphi_1})}$$

FIG. 28

$$\frac{\alpha_2(1-e^{j\varphi_2})}{\alpha_1(1+e^{j\varphi_1})}$$

FIG. 27

$$angle\left\{\frac{1-\left(\frac{\alpha_2(1-e^{j\varphi_2})}{\alpha_1(1+e^{j\varphi_1})}\right)/\frac{\alpha_2(1+e^{j\varphi_2})}{\alpha_1(1+e^{j\varphi_1})}}{1+\left(\frac{\alpha_2(1-e^{j\varphi_2})}{\alpha_1(1+e^{j\varphi_1})}\right)/\frac{\alpha_2(1+e^{j\varphi_2})}{\alpha_1(1+e^{j\varphi_1})}}\right\} = \varphi_2$$

FIG. 29

PHASED ARRAY ANTENNA WITH ANALOG BEAMFORMING—CALIBRATION TECHNIQUES FOR ANGLE OF ARRIVAL APPLICATIONS

TECHNICAL FIELD

The present application relates to wireless devices, and more particularly to apparatuses, systems, and methods for calibration of antenna arrays for estimating angle-of-arrival.

DESCRIPTION OF THE RELATED ART

Wireless communication systems are rapidly growing in usage. Further, wireless communication technology has evolved from voice-only communications to also include the transmission of data, such as Internet and multimedia content.

Mobile electronic devices may take the form of smart phones or tablets that a user typically carries. Wearable devices (also referred to as accessory devices) are a newer form of mobile electronic device, one example being smart watches. Additionally, low-cost low-complexity wireless devices intended for stationary or nomadic deployment are also proliferating as part of the developing "Internet of Things". In other words, there is an increasingly wide range of desired device complexities, capabilities, traffic patterns, and other characteristics.

One use case for wireless communication includes sensing applications, e.g., estimating the distance or angle between multiple devices. For example, angle-of-arrival estimation can provide the relative direction from one wireless device to another. However, existing wireless communication technologies may suffer from one or more of slow measurement and/or complex calibration. Accordingly, improvements in the field are desired.

SUMMARY

Embodiments are presented herein of, inter alia, systems, apparatuses, and methods for wireless devices performing calibration of an antenna array for angle of arrival estimation.

According to the techniques described herein, a wireless device may calibrate an antenna array, including M antenna elements. The wireless device may receive a calibration signal using the antenna array. The calibration signal may be received from a single angle. The wireless device may calibrate M−1 of the antenna elements based on the calibration signal. The remaining antenna element (e.g., the Mth antenna element) may remain uncalibrated. The wireless device may perform an angle of arrival estimation (e.g., of a subsequent signal) using the M−1 calibrated antenna elements. The wireless device may disregard the remaining, uncalibrated antenna element for the angle of arrival estimation.

Further, according to the techniques described herein, the Mth antenna element may also be calibrated. This calibration may use a number, K, of calibration targets (e.g., signals from K directions). In the case that K is less than M, a Moore-Penrose pseudo-inverse may be used to calibrate the Mth antenna element. Thus, all M antenna elements may be calibrated and the wireless device may perform an angle of arrival estimation (e.g., of a subsequent signal) using the M antenna elements.

The techniques described herein may be implemented in and/or used with a number of different types of devices, including but not limited to cellular phones, tablet computers, accessory and/or wearable computing devices, portable media players, vehicles, access points and other wireless local area network equipment, cellular base stations and other cellular network infrastructure equipment, servers, and any of various other computing devices.

This summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the disclosed embodiments can be obtained when the following detailed description is considered in conjunction with the following drawings, in which:

FIG. 13 illustrates Hadamard coding for 2 antennas, according to some embodiments;

FIG. 14 illustrates Hadamard coding for 4 antennas, according to some embodiments;

FIG. 15 illustrates calibration using a single target, according to some embodiments;

FIGS. 16-19 illustrate an exemplary calibration of an array of eight elements, according to some embodiments;

FIGS. 22-29 illustrate aspects of calibrating an additional antenna, according to some embodiments.

Figure 1:
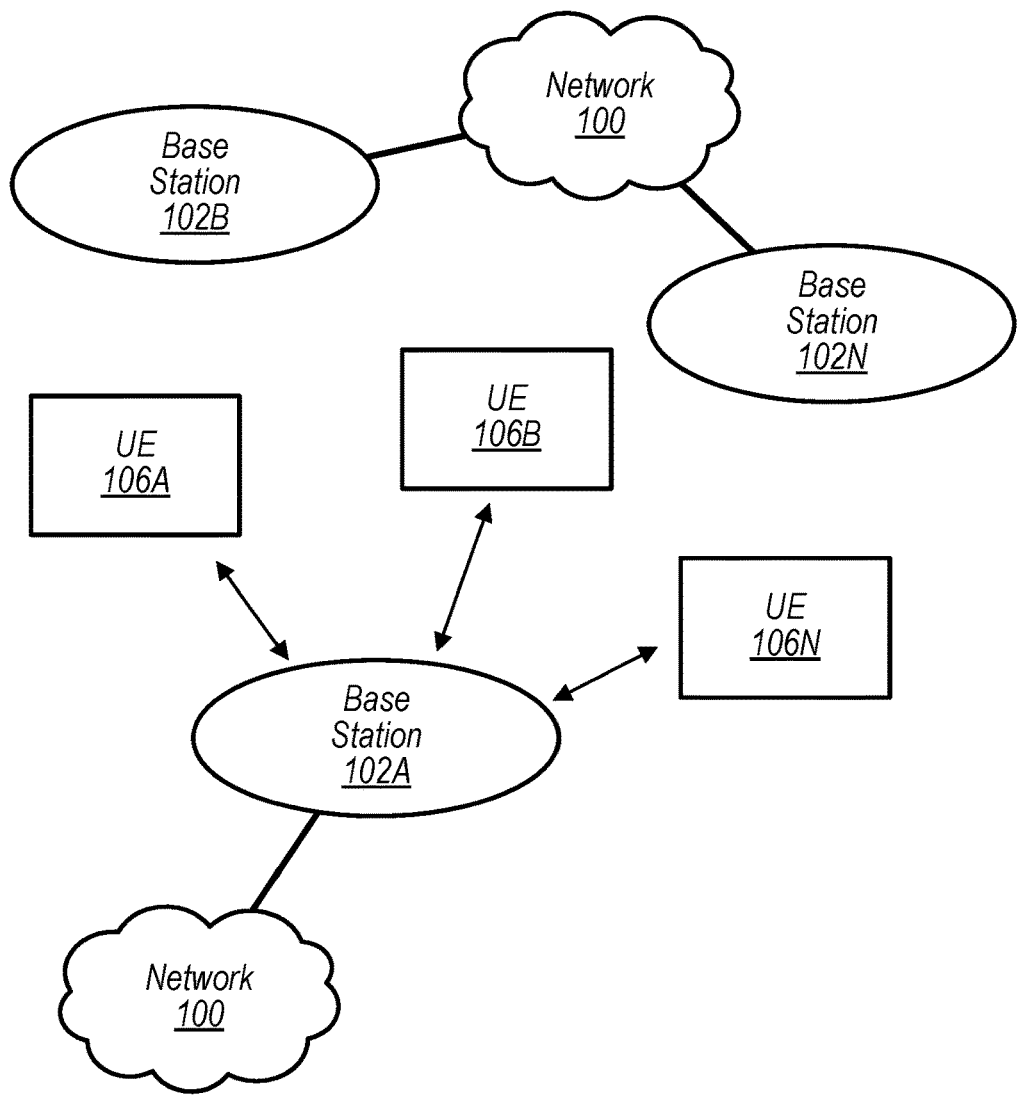
FIG. 1 illustrates an example wireless communication system, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Terms

The following is a glossary of terms used in the present application:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

User Equipment (UE) (or "UE Device")—any of various types of computer systems devices which are mobile or portable and which performs wireless communications. Examples of UE devices include mobile telephones or smart phones (e.g., iPhone™, Android™-based phones), portable gaming devices (e.g., Nintendo DS™ PlayStation Portable™, Gameboy Advance™, iPhone™), laptops, wearable devices (e.g. smart watch, smart glasses), PDAs, portable Internet devices, music players, data storage devices, or other handheld devices, etc. In general, the term "UE" or "UE device" can be broadly defined to encompass any electronic, computing, and/or telecommunications device (or combination of devices) which is easily transported by a user and capable of wireless communication.

Wireless Device—any of various types of computer system devices which performs wireless communications. A wireless device can be portable (or mobile) or may be stationary or fixed at a certain location. A UE is an example of a wireless device.

Communication Device—any of various types of computer systems or devices that perform communications, where the communications can be wired or wireless. A communication device can be portable (or mobile) or may be stationary or fixed at a certain location. A wireless device is an example of a communication device. A UE is another example of a communication device. A communication device may be referred to as a station or STA.

Base Station or Access Point (AP)—The term "Base Station" has the full breadth of its ordinary meaning, and at least includes a wireless communication station installed at a fixed location and used to communicate as part of a wireless telephone system or radio system. The term "access point" is used similarly.

Link Budget Limited—includes the full breadth of its ordinary meaning, and at least includes a characteristic of a wireless device (e.g., a UE) which exhibits limited communication capabilities, or limited power, relative to a device that is not link budget limited, or relative to devices for which a radio access technology (RAT) standard has been developed. A wireless device that is link budget limited may experience relatively limited reception and/or transmission capabilities, which may be due to one or more factors such as device design, device size, battery size, antenna size or design, transmit power, receive power, current transmission medium conditions, and/or other factors. Such devices may be referred to herein as "link budget limited" (or "link budget constrained") devices. A device may be inherently link budget limited due to its size, battery power, and/or transmit/receive power. For example, a smart watch that is communicating over LTE or LTE-A with a base station may be inherently link budget limited due to its reduced transmit/receive power and/or reduced antenna. Wearable devices, such as smart watches, are generally link budget limited devices. Alternatively, a device may not be inherently link budget limited, e.g., may have sufficient size, battery power, and/or transmit/receive power for normal communications over LTE or LTE-A, but may be temporarily link budget limited due to current communication conditions, e.g., a smart phone being at the edge of a cell, etc. It is noted that the term "link budget limited" includes or encompasses power limitations, and thus a power limited device may be considered a link budget limited device.

Processing Element—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Wi-Fi—The term "Wi-Fi" has the full breadth of its ordinary meaning, and at least includes a wireless communication network or RAT that is serviced by wireless LAN (WLAN) access points and which provides connectivity through these access points to the Internet. Most modern Wi-Fi networks (or WLAN networks) are based on IEEE 802.11 standards and are marketed under the name "Wi-Fi". A Wi-Fi (WLAN) network is different from a cellular network. Wi-Fi or WLAN may refer to technology based on IEEE 802.11 wireless standards such as 802.11a, 802.11.b, 802.11g, 802.11n, 802.11-2012, 802.11ac, 802.11ad, 802.11.ax, 802.11ay, 802.11az, and/or other IEEE 802.11 standards.

Automatically—refers to an action or operation performed by a computer system (e.g., software executed by the computer system) or device (e.g., circuitry, programmable hardware elements, ASICs, etc.), without user input directly specifying or performing the action or operation. Thus, the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Figure 2:
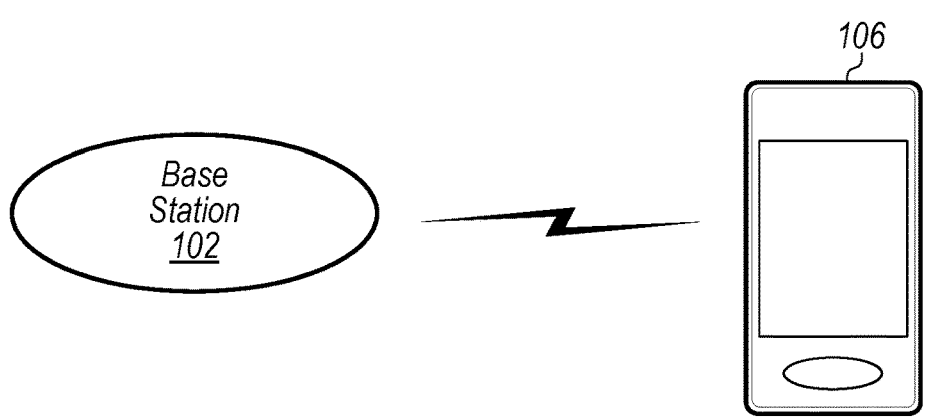
FIG. 2 illustrates a base station (BS) in communication with a user equipment (UE) device, according to some embodiments.

FIGS. 1 and 2—Communication System

FIG. 1 illustrates a simplified example wireless communication system, according to some embodiments. It is noted that the system of FIG. 1 is merely one example of a possible system, and that features of this disclosure may be implemented in any of various systems, as desired.

As shown, the example wireless communication system includes a base station 102 which communicates over a transmission medium with one or more user devices 106A, 106B, etc., through 106N. Each of the user devices may be referred to herein as a "user equipment" (UE). Thus, the user devices 106 are referred to as UEs or UE devices.

The base station (BS) 102 may be a base transceiver station (BTS) or cell site (a "cellular base station"), and may include hardware that enables wireless communication with the UEs 106A through 106N.

The communication area (or coverage area) of the base station may be referred to as a "cell." The base station 102 and the UEs 106 may be configured to communicate over the transmission medium using any of various radio access technologies (RATs), also referred to as wireless communication technologies, or telecommunication standards, such as GSM, UMTS (associated with, for example, WCDMA or TD-SCDMA air interfaces), LTE, LTE-Advanced (LTE-A), 5G new radio (5G NR), HSPA, 3GPP2 CDMA2000 (e.g., 1xRTT, 1xEV-DO, HRPD, eHRPD), etc. Note that if the base station 102 is implemented in the context of LTE, it may alternately be referred to as an 'eNodeB' or 'eNB'. Note that if the base station 102 is implemented in the context of 5G NR, it may alternately be referred to as gNodeB' or gNB'.

As shown, the base station 102 may also be equipped to communicate with a network 100 (e.g., a core network of a cellular service provider, a telecommunication network such as a public switched telephone network (PSTN), and/or the Internet, among various possibilities). Thus, the base station 102 may facilitate communication between the user devices and/or between the user devices and the network 100. In particular, the cellular base station 102 may provide UEs 106 with various telecommunication capabilities, such as voice, SMS and/or data services.

Base station 102 and other similar base stations operating according to the same or a different cellular communication standard may thus be provided as a network of cells, which may provide continuous or nearly continuous overlapping service to UEs 106A-N and similar devices over a geographic area via one or more cellular communication standards.

Thus, while base station 102 may act as a "serving cell" for UEs 106A-N as illustrated in FIG. 1, each UE 106 may also be capable of receiving signals from (and possibly within communication range of) one or more other cells (which might be provided by other base stations 102B-N), which may be referred to as "neighboring cells". Such cells may also be capable of facilitating communication between user devices and/or between user devices and the network 100. Such cells may include "macro" cells, "micro" cells, "pico" cells, and/or cells which provide any of various other granularities of service area size. Other configurations are also possible.

In some embodiments, base station 102 may be a next generation base station, e.g., a 5G New Radio (5G NR) base station, or "gNB". In some embodiments, a gNB may be connected to a legacy evolved packet core (EPC) network and/or to a NR core (NRC) network. In addition, a gNB cell may include one or more transition and reception points (TRPs). In addition, a UE capable of operating according to 5G NR may be connected to one or more TRPs within one or more gNBs.

Note that a UE 106 may be capable of communicating using multiple wireless communication standards. For example, the UE 106 may be configured to communicate using a wireless networking (e.g., Wi-Fi) and/or peer-to-peer wireless communication protocol (e.g., Bluetooth, Wi-Fi peer-to-peer, etc.) in addition to at least one cellular communication protocol (e.g., GSM, UMTS (associated with, for example, WCDMA or TD-SCDMA air interfaces), LTE, LTE-A, 5G NR, HSPA, 3GPP2 CDMA2000 (e.g., 1×RTT, 1×EV-DO, HRPD, eHRPD), etc.). The UE 106 may also or alternatively be configured to communicate using one or more global navigational satellite systems (GNSS, e.g., GPS or GLONASS), one or more mobile television broadcasting standards (e.g., ATSC-M/H), and/or any other wireless communication protocol, if desired. Other combinations of wireless communication standards (including more than two wireless communication standards) are also possible.

FIG. 2 illustrates user equipment 106 (e.g., one of the devices 106A through 106N) in communication with a base station 102, according to some embodiments. The UE 106 may be a device with cellular communication capability such as a mobile phone, a hand-held device, a computer or a tablet, or virtually any type of wireless device.

The UE 106 may include a processor that is configured to execute program instructions stored in memory. The UE 106 may perform any of the method embodiments described herein by executing such stored instructions. Alternatively, or in addition, the UE 106 may include a programmable hardware element such as an FPGA (field-programmable gate array) that is configured to perform any of the method embodiments described herein, or any portion of any of the method embodiments described herein.

The UE 106 may include one or more antennas for communicating using one or more wireless communication protocols or technologies. In some embodiments, the UE 106 may be configured to communicate using, for example, CDMA2000 (1×RTT/1×EV-DO/HRPD/eHRPD) or LTE using a single shared radio and/or GSM or LTE using the single shared radio. The shared radio may couple to a single antenna, or may couple to multiple antennas (e.g., for multiple-input, multiple-output or "MIMO") for performing wireless communications. In general, a radio may include any combination of a baseband processor, analog RF signal processing circuitry (e.g., including filters, mixers, oscillators, amplifiers, etc.), or digital processing circuitry (e.g., for digital modulation as well as other digital processing). Similarly, the radio may implement one or more receive and transmit chains using the aforementioned hardware. For example, the UE 106 may share one or more parts of a receive and/or transmit chain between multiple wireless communication technologies, such as those discussed above.

In some embodiments, the UE 106 may include any number of antennas and may be configured to use the antennas to transmit and/or receive directional wireless signals (e.g., beams). Similarly, the BS 102 may also include any number of antennas and may be configured to use the antennas to transmit and/or receive directional wireless signals (e.g., beams). To receive and/or transmit such directional signals, the antennas of the UE 106 and/or BS 102 may be configured to apply different "weight" to different antennas. The process of applying these different weights may be referred to as "precoding".

In some embodiments, the UE 106 may include separate transmit and/or receive chains (e.g., including separate antennas and other radio components) for each wireless communication protocol with which it is configured to communicate. As a further possibility, the UE 106 may include one or more radios which are shared between multiple wireless communication protocols, and one or more radios which are used exclusively by a single wireless communication protocol. For example, the UE 106 might include a shared radio for communicating using either of LTE or 5G NR (or LTE or 1×RTT or LTE or GSM), and separate radios for communicating using each of Wi-Fi and Bluetooth. Other configurations are also possible.

Figure 3:
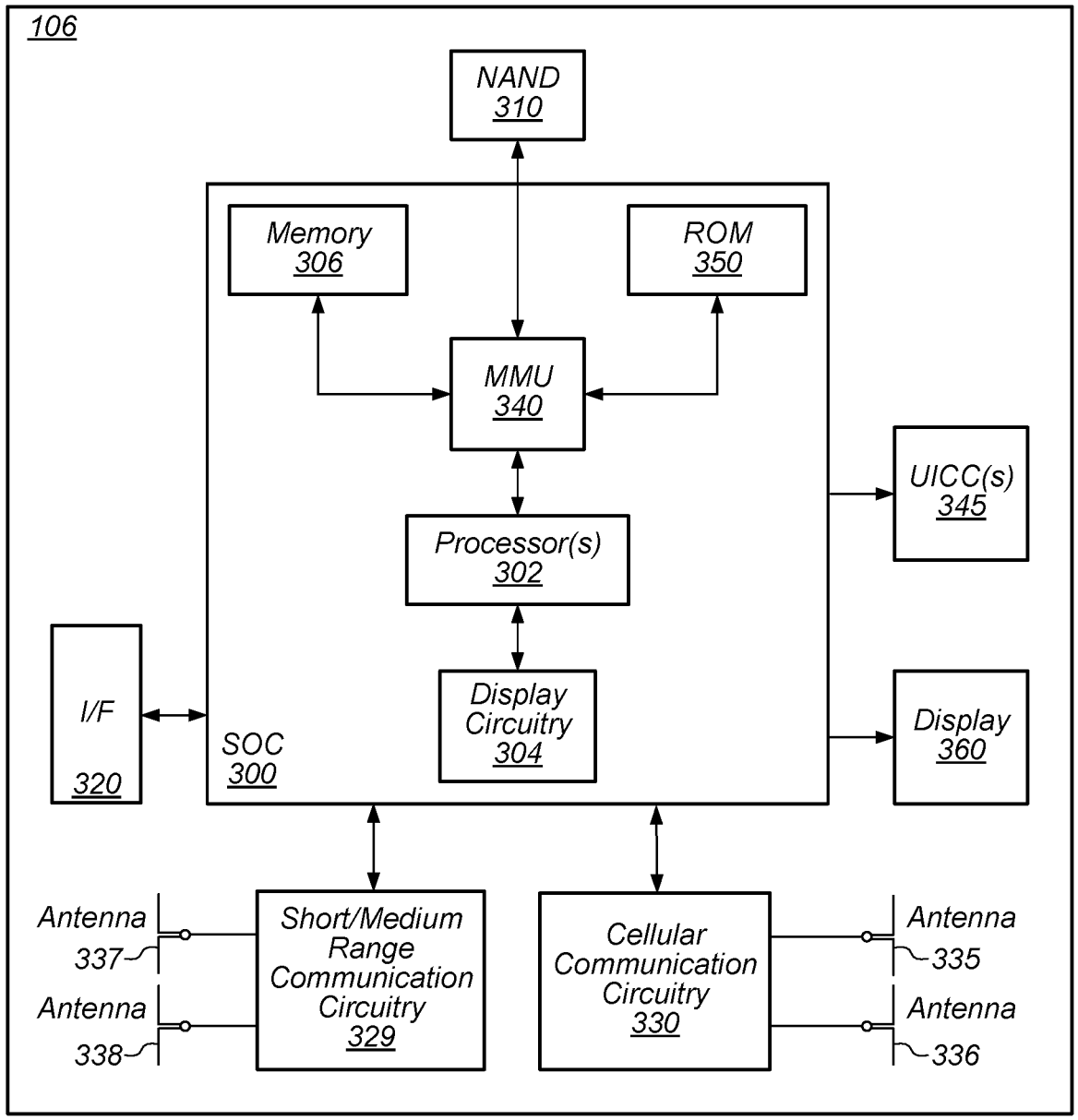
FIG. 3 illustrates an example block diagram of a UE, according to some embodiments.

FIG. 3—Block Diagram of a UE

FIG. 3 illustrates an example simplified block diagram of a communication device 106, according to some embodiments. It is noted that the block diagram of the communication device of FIG. 3 is only one example of a possible communication device. According to embodiments, communication device 106 may be a user equipment (UE) device, a mobile device or mobile station, a wireless device or wireless station, a desktop computer or computing device, a mobile computing device (e.g., a laptop, notebook, or portable computing device), a tablet and/or a combination of devices, among other devices. As shown, the communication device 106 may include a set of components 300 configured to perform core functions. For example, this set of components may be implemented as a system on chip (SOC), which may include portions for various purposes. Alternatively, this set of components 300 may be implemented as separate components or groups of components for the various purposes. The set of components 300 may be coupled (e.g., communicatively; directly or indirectly) to various other circuits of the communication device 106.

For example, the communication device 106 may include various types of memory (e.g., including NAND flash 310), an input/output interface such as connector I/F 320 (e.g., for connecting to a computer system; dock; charging station; input devices, such as a microphone, camera, keyboard; output devices, such as speakers; etc.), the display 360, which may be integrated with or external to the communication device 106, and cellular communication circuitry 330 such as for 5G NR, LTE, GSM, etc., and short to medium range wireless communication circuitry 329 (e.g., Bluetooth™ and WLAN circuitry). In some embodiments, communication device 106 may include wired communication circuitry (not shown), such as a network interface card, e.g., for Ethernet.

The cellular communication circuitry 330 may couple (e.g., communicatively; directly or indirectly) to one or more antennas, such as antennas 335 and 336 as shown. The short to medium range wireless communication circuitry 329 may also couple (e.g., communicatively; directly or indirectly) to one or more antennas, such as antennas 337 and 338 as shown. Alternatively, the short to medium range wireless communication circuitry 329 may couple (e.g., communicatively; directly or indirectly) to the antennas 335 and 336 in addition to, or instead of, coupling (e.g., communicatively; directly or indirectly) to the antennas 337 and 338. The short to medium range wireless communication circuitry 329 and/or cellular communication circuitry 330 may include multiple receive chains and/or multiple transmit chains for receiving and/or transmitting multiple spatial streams, such as in a multiple-input multiple output (MIMO) configuration.

In some embodiments, as further described below, cellular communication circuitry 330 may include dedicated receive chains (including and/or coupled to, e.g., communicatively; directly or indirectly, dedicated processors and/or radios) for multiple RATs (e.g., a first receive chain for LTE and a second receive chain for 5G NR). In addition, in some embodiments, cellular communication circuitry 330 may include a single transmit chain that may be switched between radios dedicated to specific RATs. For example, a first radio may be dedicated to a first RAT, e.g., LTE, and may be in communication with a dedicated receive chain and a transmit chain shared with an additional radio, e.g., a second radio that may be dedicated to a second RAT, e.g., 5G NR, and may be in communication with a dedicated receive chain and the shared transmit chain.

The communication device 106 may also include and/or be configured for use with one or more user interface elements. The user interface elements may include any of various elements, such as display 360 (which may be a touchscreen display), a keyboard (which may be a discrete keyboard or may be implemented as part of a touchscreen display), a mouse, a microphone and/or speakers, one or more cameras, one or more buttons, and/or any of various other elements capable of providing information to a user and/or receiving or interpreting user input.

The communication device 106 may further include one or more smart cards 345 that include SIM (Subscriber Identity Module) functionality, such as one or more UICC(s) (Universal Integrated Circuit Card(s)) cards 345.

As shown, the SOC 300 may include processor(s) 302, which may execute program instructions for the communication device 106 and display circuitry 304, which may perform graphics processing and provide display signals to the display 360. The processor(s) 302 may also be coupled to memory management unit (MMU) 340, which may be configured to receive addresses from the processor(s) 302 and translate those addresses to locations in memory (e.g., memory 306, read only memory (ROM) 350, NAND flash memory 310) and/or to other circuits or devices, such as the display circuitry 304, short range wireless communication circuitry 229, cellular communication circuitry 330, connector I/F 320, and/or display 360. The MMU 340 may be configured to perform memory protection and page table translation or set up. In some embodiments, the MMU 340 may be included as a portion of the processor(s) 302.

As noted above, the communication device 106 may be configured to communicate using wireless and/or wired communication circuitry. The communication device 106 may be configured to transmit a request to attach to a first network node operating according to the first RAT and transmit an indication that the wireless device is capable of maintaining substantially concurrent connections with the first network node and a second network node that operates according to the second RAT. The wireless device may also be configured transmit a request to attach to the second network node. The request may include an indication that the wireless device is capable of maintaining substantially concurrent connections with the first and second network nodes. Further, the wireless device may be configured to receive an indication that dual connectivity (DC) with the first and second network nodes has been established.

As described herein, the communication device 106 may include hardware and software components for implementing features for using multiplexing to perform transmissions according to multiple radio access technologies in the same frequency carrier (e.g., and/or multiple frequency carriers), as well as the various other techniques described herein. The processor 302 of the communication device 106 may be configured to implement part or all of the features described herein, e.g., by executing program instructions stored on a memory medium (e.g., a non-transitory computer-readable memory medium). Alternatively (or in addition), processor 302 may be configured as a programmable hardware element, such as an FPGA (Field Programmable Gate Array), or as an ASIC (Application Specific Integrated Circuit). Alternatively (or in addition) the processor 302 of the communication device 106, in conjunction with one or more of the other components 300, 304, 306, 310, 320, 329, 330, 340, 345, 350, 360 may be configured to implement part or all of the features described herein.

In addition, as described herein, processor 302 may include one or more processing elements. Thus, processor 302 may include one or more integrated circuits (ICs) that are configured to perform the functions of processor 302. In addition, each integrated circuit may include circuitry (e.g., first circuitry, second circuitry, etc.) configured to perform the functions of processor(s) 302.

Further, as described herein, cellular communication circuitry 330 and short range wireless communication circuitry 329 may each include one or more processing elements and/or processors. In other words, one or more processing elements/processors may be included in cellular communication circuitry 330 and, similarly, one or more processing elements/processors may be included in short range wireless communication circuitry 329. Thus, cellular communication circuitry 330 may include one or more integrated circuits (ICs) that are configured to perform the functions of cellular communication circuitry 330. In addition, each integrated circuit may include circuitry (e.g., first circuitry, second circuitry, etc.) configured to perform the functions of cellular communication circuitry 330. Similarly, the short range wireless communication circuitry 329 may include one or more ICs that are configured to perform the functions of short range wireless communication circuitry 329. In addition, each integrated circuit may include circuitry (e.g., first circuitry, second circuitry, etc.) configured to perform the functions of short range wireless communication circuitry 329.

Figure 4:
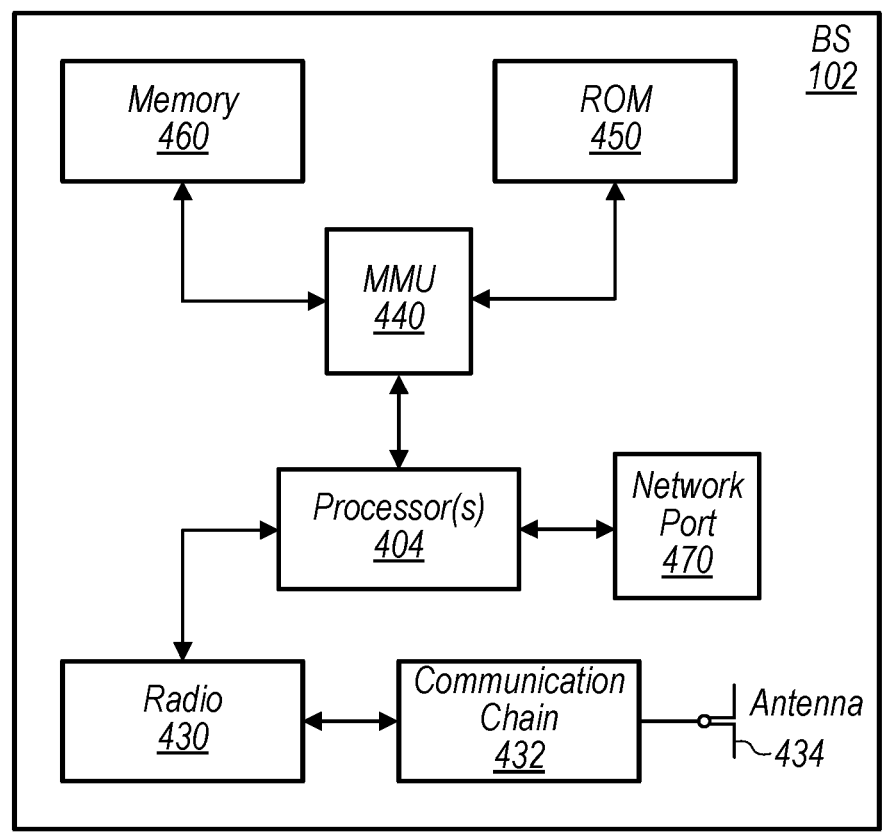
FIG. 4 illustrates an example block diagram of a BS, according to some embodiments.

FIG. 4—Block Diagram of a Base Station

FIG. 4 illustrates an example block diagram of a base station 102, according to some embodiments. It is noted that the base station of FIG. 4 is merely one example of a possible base station. As shown, the base station 102 may include processor(s) 404 which may execute program instructions for the base station 102. The processor(s) 404 may also be coupled to memory management unit (MMU) 440, which may be configured to receive addresses from the processor(s) 404 and translate those addresses to locations in memory (e.g., memory 460 and read only memory (ROM) 450) or to other circuits or devices.

The base station 102 may include at least one network port 470. The network port 470 may be configured to couple to a telephone network and provide a plurality of devices, such as UE devices 106, access to the telephone network as described above in FIGS. 1 and 2.

The network port 470 (or an additional network port) may also or alternatively be configured to couple to a cellular network, e.g., a core network of a cellular service provider. The core network may provide mobility related services and/or other services to a plurality of devices, such as UE devices 106. In some cases, the network port 470 may couple to a telephone network via the core network, and/or the core network may provide a telephone network (e.g., among other UE devices serviced by the cellular service provider).

In some embodiments, base station 102 may be a next generation base station, e.g., a 5G New Radio (5G NR) base station, or "gNB". In such embodiments, base station 102 may be connected to a legacy evolved packet core (EPC) network and/or to a NR core (NRC) network. In addition, base station 102 may be considered a 5G NR cell and may include one or more transition and reception points (TRPs).

In addition, a UE capable of operating according to 5G NR may be connected to one or more TRPs within one or more gNB s.

The base station 102 may include at least one antenna 434, and possibly multiple antennas. The radio 430 and at least one antenna 434 may be configured to operate as a wireless transceiver and may be further configured to communicate with UE devices 106. The antenna 434 may communicate with the radio 430 via communication chain 432. Communication chain 432 may be a receive chain, a transmit chain or both. The radio 430 may be configured to communicate via various wireless communication standards, including, but not limited to, 5G NR, LTE, LTE-A, GSM, UMTS, CDMA2000, Wi-Fi, etc.

The base station 102 may be configured to communicate wirelessly using multiple wireless communication standards. In some instances, the base station 102 may include multiple radios, which may enable the base station 102 to communicate according to multiple wireless communication technologies. For example, as one possibility, the base station 102 may include an LTE radio for performing communication according to LTE as well as a 5G NR radio for performing communication according to 5G NR. In such a case, the base station 102 may be capable of operating as both an LTE base station and a 5G NR base station. As another possibility, the base station 102 may include a multi-mode radio which is capable of performing communications according to any of multiple wireless communication technologies (e.g., 5G NR and Wi-Fi, LTE and Wi-Fi, LTE and UMTS, LTE and CDMA2000, UMTS and GSM, etc.).

As described further subsequently herein, the BS 102 may include hardware and software components for implementing or supporting implementation of features described herein. The processor 404 of the base station 102 may be configured to implement or support implementation of part or all of the methods described herein, e.g., by executing program instructions stored on a memory medium (e.g., a non-transitory computer-readable memory medium). Alternatively, the processor 404 may be configured as a programmable hardware element, such as an FPGA (Field Programmable Gate Array), or as an ASIC (Application Specific Integrated Circuit), or a combination thereof. Alternatively (or in addition) the processor 404 of the BS 102, in conjunction with one or more of the other components 430, 432, 434, 440, 450, 460, 470 may be configured to implement or support implementation of part or all of the features described herein.

In addition, as described herein, processor(s) 404 may include one or more processing elements. Thus, processor(s) 404 may include one or more integrated circuits (ICs) that are configured to perform the functions of processor(s) 404. In addition, each integrated circuit may include circuitry (e.g., first circuitry, second circuitry, etc.) configured to perform the functions of processor(s) 404.

Further, as described herein, radio 430 may include one or more processing elements. Thus, radio 430 may include one or more integrated circuits (ICs) that are configured to perform the functions of radio 430. In addition, each integrated circuit may include circuitry (e.g., first circuitry, second circuitry, etc.) configured to perform the functions of radio 430.

Figure 5:
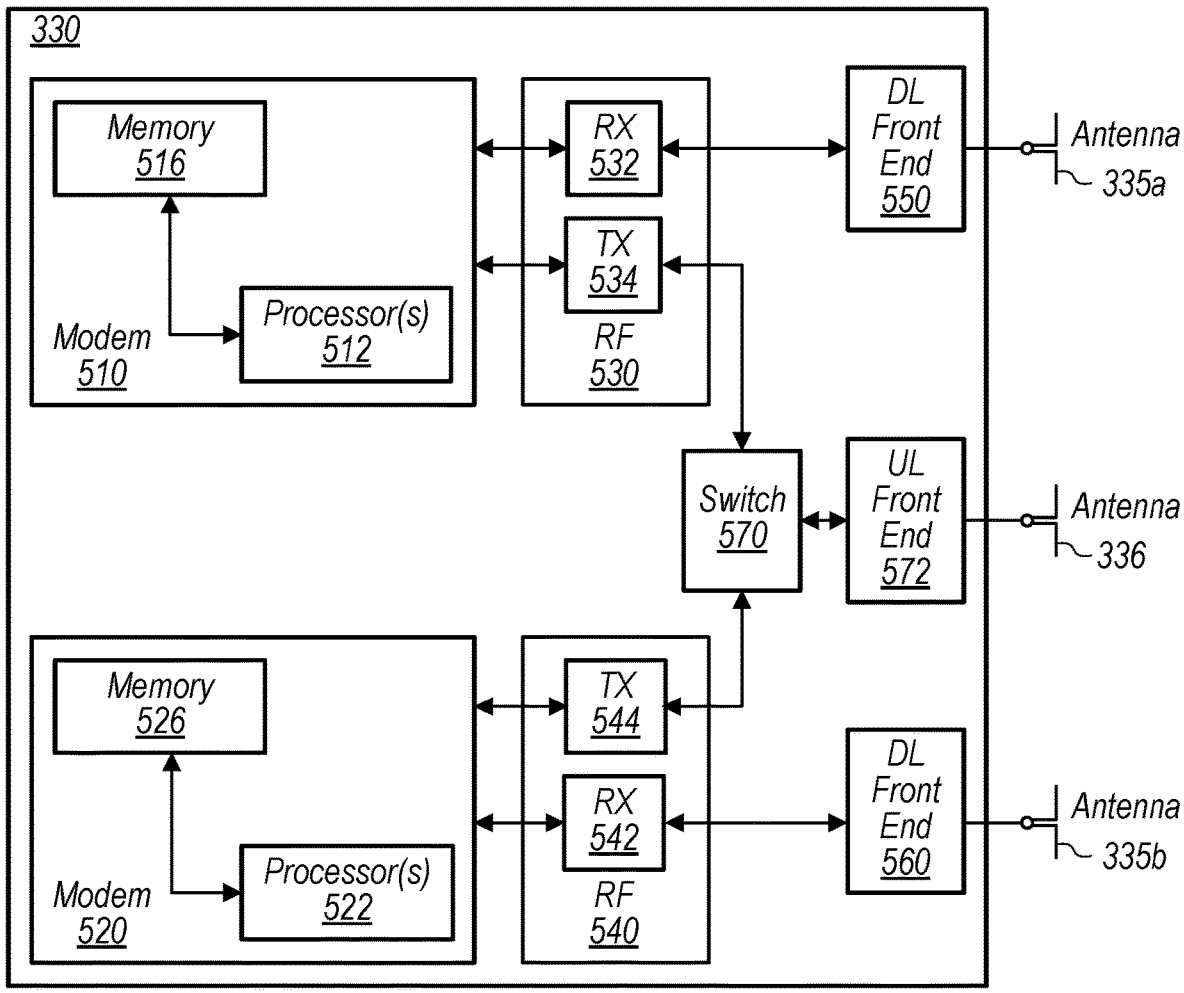
FIG. 5 illustrates an example block diagram of cellular communication circuitry, according to some embodiments.

FIG. 5—Block Diagram of Cellular Communication Circuitry

FIG. 5 illustrates an example simplified block diagram of cellular communication circuitry, according to some embodiments. It is noted that the block diagram of the cellular communication circuitry of FIG. 5 is only one example of a possible cellular communication circuit; other circuits, such as circuits including or coupled to sufficient antennas for different RATs to perform uplink activities using separate antennas, are also possible. According to embodiments, cellular communication circuitry 330 may be included in a communication device, such as communication device 106 described above. As noted above, communication device 106 may be a user equipment (UE) device, a mobile device or mobile station, a wireless device or wireless station, a desktop computer or computing device, a mobile computing device (e.g., a laptop, notebook, or portable computing device), a tablet and/or a combination of devices, among other devices.

The cellular communication circuitry 330 may couple (e.g., communicatively; directly or indirectly) to one or more antennas, such as antennas 335a-b and 336 as shown (in FIG. 3). In some embodiments, cellular communication circuitry 330 may include dedicated receive chains (including and/or coupled to, e.g., communicatively; directly or indirectly. dedicated processors and/or radios) for multiple RATs (e.g., a first receive chain for LTE and a second receive chain for 5G NR). For example, as shown in FIG. 5, cellular communication circuitry 330 may include a modem 510 and a modem 520. Modem 510 may be configured for communications according to a first RAT, e.g., such as LTE or LTE-A, and modem 520 may be configured for communications according to a second RAT, e.g., such as 5G NR.

As shown, modem 510 may include one or more processors 512 and a memory 516 in communication with processors 512. Modem 510 may be in communication with a radio frequency (RF) front end 530. RF front end 530 may include circuitry for transmitting and receiving radio signals. For example, RF front end 530 may include receive circuitry (RX) 532 and transmit circuitry (TX) 534. In some embodiments, receive circuitry 532 may be in communication with downlink (DL) front end 550, which may include circuitry for receiving radio signals via antenna 335a.

Similarly, modem 520 may include one or more processors 522 and a memory 526 in communication with processors 522. Modem 520 may be in communication with an RF front end 540. RF front end 540 may include circuitry for transmitting and receiving radio signals. For example, RF front end 540 may include receive circuitry 542 and transmit circuitry 544. In some embodiments, receive circuitry 542 may be in communication with DL front end 560, which may include circuitry for receiving radio signals via antenna 335b.

In some embodiments, a switch 570 may couple transmit circuitry 534 to uplink (UL) front end 572. In addition, switch 570 may couple transmit circuitry 544 to UL front end 572. UL front end 572 may include circuitry for transmitting radio signals via antenna 336. Thus, when cellular communication circuitry 330 receives instructions to transmit according to the first RAT (e.g., as supported via modem 510), switch 570 may be switched to a first state that allows modem 510 to transmit signals according to the first RAT (e.g., via a transmit chain that includes transmit circuitry 534 and UL front end 572). Similarly, when cellular communication circuitry 330 receives instructions to transmit according to the second RAT (e.g., as supported via modem 520), switch 570 may be switched to a second state that allows modem 520 to transmit signals according to the second RAT (e.g., via a transmit chain that includes transmit circuitry 544 and UL front end 572).

In some embodiments, the cellular communication circuitry 330 may be configured to transmit, via the first modem while the switch is in the first state, a request to attach to a first network node operating according to the first RAT and transmit, via the first modem while the switch is in a first state, an indication that the wireless device is capable of maintaining substantially concurrent connections with the first network node and a second network node that operates according to the second RAT. The wireless device may also be configured transmit, via the second radio while the switch is in a second state, a request to attach to the second network node. The request may include an indication that the wireless device is capable of maintaining substantially concurrent connections with the first and second network nodes. Further, the wireless device may be configured to receive, via the first radio, an indication that dual connectivity with the first and second network nodes has been established.

As described herein, the modem 510 may include hardware and software components for implementing features for using multiplexing to perform transmissions according to multiple radio access technologies in the same frequency carrier, as well as the various other techniques described herein. The processors 512 may be configured to implement part or all of the features described herein, e.g., by executing program instructions stored on a memory medium (e.g., a non-transitory computer-readable memory medium). Alternatively (or in addition), processor 512 may be configured as a programmable hardware element, such as an FPGA (Field Programmable Gate Array), or as an ASIC (Application Specific Integrated Circuit). Alternatively (or in addition) the processor 512, in conjunction with one or more of the other components 530, 532, 534, 550, 570, 572, 335 and 336 may be configured to implement part or all of the features described herein.

In some embodiments, processor(s) 512, 522, etc. may be configured to implement or support implementation of part or all of the methods described herein, e.g., by executing program instructions stored on a memory medium (e.g., a non-transitory computer-readable memory medium). Alternatively, the processor(s) 512, 522, etc. may be configured as a programmable hardware element, such as an FPGA, or as an ASIC, or a combination thereof. In addition, as described herein, processor(s) 512, 522, etc. may include one or more processing elements. Thus, processor(s) 512, 522, etc. may include one or more integrated circuits (ICs) that are configured to perform the functions of processor(s) 512, 522, etc. In addition, each integrated circuit may include circuitry (e.g., first circuitry, second circuitry, etc.) configured to perform the functions of processor(s) 512, 522, etc.

As described herein, the modem 520 may include hardware and software components for implementing features for using multiplexing to perform transmissions according to multiple radio access technologies in the same frequency carrier, as well as the various other techniques described herein. The processors 522 may be configured to implement part or all of the features described herein, e.g., by executing program instructions stored on a memory medium (e.g., a non-transitory computer-readable memory medium). Alternatively (or in addition), processor 522 may be configured as a programmable hardware element, such as an FPGA (Field Programmable Gate Array), or as an ASIC (Application Specific Integrated Circuit). Alternatively (or in addition) the processor 522, in conjunction with one or more of the other components 540, 542, 544, 550, 570, 572, 335 and 336 may be configured to implement part or all of the features described herein.

Figure 6:
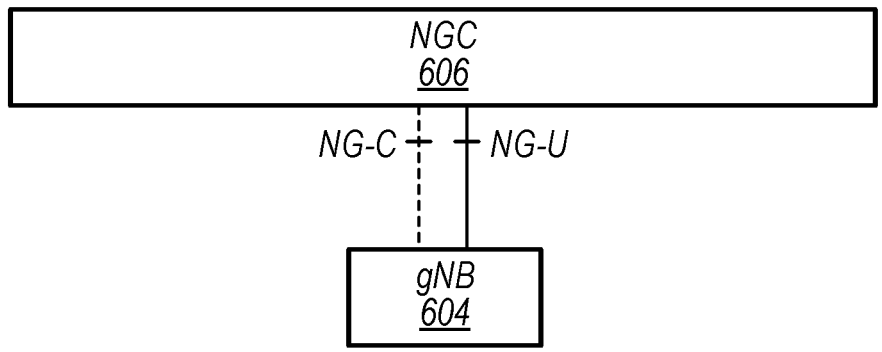
FIGS. 6 and 7 illustrate examples of a 5G NR base station (gNB), according to some embodiments.
Figure 7:
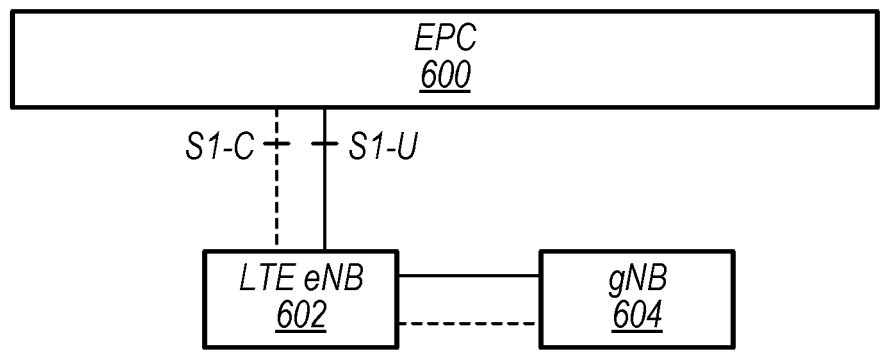

FIGS. 6-7—5G NR Architecture

In some implementations, fifth generation (5G) wireless communication will initially be deployed concurrently with other wireless communication standards (e.g., LTE). For example, whereas FIG. 6 illustrates a possible standalone (SA) implementation of a next generation core (NGC) network 606 and 5G NR base station (e.g., gNB 604), dual connectivity between LTE and 5G new radio (5G NR or NR), such as in accordance with the exemplary non-standalone (NSA) architecture illustrated in FIG. 7, has been specified as part of the initial deployment of NR. Thus, as illustrated in FIG. 7, evolved packet core (EPC) network 600 may continue to communicate with current LTE base stations (e.g., eNB 602). In addition, eNB 602 may be in communication with a 5G NR base station (e.g., gNB 604) and may pass data between the EPC network 600 and gNB 604. In some instances, the gNB 604 may also have at least a user plane reference point with EPC network 600. Thus, EPC network 600 may be used (or reused) and gNB 604 may serve as extra capacity for UEs, e.g., for providing increased downlink throughput to UEs. In other words, LTE may be used for control plane signaling and NR may be used for user plane signaling. Thus, LTE may be used to establish connections to the network and NR may be used for data services. As will be appreciated, numerous other non-standalone architecture variants are possible.

Figure 8:
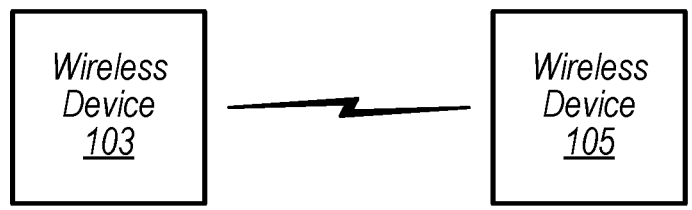
FIG. 8 is a block diagram illustrating two wireless devices performing a sensing application, according to some embodiments.

FIG. 8—Sensing Applications

FIG. 8 illustrates an exemplary (and simplified) wireless communication system in which aspects of this disclosure may be implemented. It is noted that the system of FIG. 8 is merely one example of a possible system, and embodiments of this disclosure may be implemented in any of various systems, as desired.

As shown, the exemplary wireless communication system includes a ("first") wireless device 103 in communication with another ("second") wireless device (or devices) 105. The first wireless device 103 and the second wireless device(s) 105 may communicate wirelessly using any of a variety of wireless communication techniques, potentially including wireless communication techniques for estimating angle/direction (e.g., angle-of-arrival (AOA)).

As one possibility, the first wireless device 103 and the second wireless device(s) 105 may estimate angle using wireless local area networking (WLAN) communication technology (e.g., IEEE 802.11/Wi-Fi based communication) and/or techniques based on WLAN wireless communication. Among various possibilities, WLAN communication may be used to perform the techniques described herein. However, additional or alternative types of wireless communication may be used to perform the techniques, according to some embodiments. For example, the angle of arrival (AOA) estimation (or other sensing techniques) described herein may be performed using WLAN or various other wireless technologies, including BT, BLE, NFC, or cellular, etc.

One or both of the wireless device 103 and the wireless device(s) 105 may also be capable of communicating via one or more additional wireless communication protocols, such as any of Bluetooth (BT), Bluetooth Low Energy (BLE), near field communication (NFC), GSM, UMTS (WCDMA, TDSCDMA), LTE, LTE-Advanced (LTE-A), NR, 3GPP2 CDMA2000 (e.g., 1×RTT, 1×EV-DO, HRPD, eHRPD), Wi-MAX, GPS, etc.

The wireless devices 103 and 105 may be any of a variety of types of wireless device. As one possibility, one or more of the wireless devices 103 and/or 105 may be a substantially portable wireless user equipment (UE) device, such as a smart phone, hand-held device, a wearable device such as a smart watch, a tablet, a motor vehicle, or virtually any type of wireless device. As another possibility, one or more of the wireless devices 103 and/or 105 may be a substantially stationary device, such as a set top box, media player (e.g., an audio or audiovisual device), gaming console, desktop computer, appliance, door, access point, base station, or any of a variety of other types of device.

Each of the wireless devices 103 and 105 may include wireless communication circuitry configured to facilitate the performance of wireless communication, which may include various digital and/or analog radio frequency (RF) components, a processor that is configured to execute program instructions stored in memory, a programmable hardware element such as a field-programmable gate array (FPGA), and/or any of various other components. The wireless device 103 and/or the wireless device 105 may perform any of the method embodiments described herein, or any portion of any of the method embodiments described herein, using any or all of such components. For example, the wireless device 103 and/or the wireless device(s) 105 may include one or more processors or processing elements that may be configured to cause the wireless device to cause the device to perform any of the method embodiments described herein, or any portion of any of the method embodiments described herein, using any or all of such components.

Each of the wireless devices 103 and 105 may include one or more antennas for communicating using one or more wireless communication protocols. In some cases, one or more parts of a receive and/or transmit chain may be shared between multiple wireless communication standards; for example, a device might be configured to communicate using either of Bluetooth or Wi-Fi using partially or entirely shared wireless communication circuitry (e.g., using a shared radio or at least shared radio components). The shared communication circuitry may include a single antenna, or may include multiple antennas (e.g., for multiple-input and multiple-output (MIMO)) for performing wireless communications. Alternatively, a device may include separate transmit and/or receive chains (e.g., including separate antennas and other radio components) for each wireless communication protocol with which it is configured to communicate. As a further possibility, a device may include one or more radios or radio components which are shared between multiple wireless communication protocols, and one or more radios or radio components which are used exclusively by a single wireless communication protocol. For example, a device might include a shared radio for communicating using one or more of LTE, CDMA2000 1×RTT, GSM, and/or 5G NR, and separate radios for communicating using each of Wi-Fi and Bluetooth. Other configurations are also possible.

As previously noted, aspects of this disclosure may be implemented in conjunction with the wireless communication system of FIG. 1. For example, the wireless devices 103 and/or 105 may perform one or more sensing wireless communication techniques or features described herein with respect to the Figures. By utilizing such techniques (and/or other techniques described herein), the wireless device(s) may (at least according to some embodiments) be able to achieve angle of arrival (AOA) communication with improved performance relative to previous techniques without relying on calibration from numerous directions. The wireless devices 103 and/or 105 may be referred to as STAs.

Wireless sensing techniques may be used to determine the distance and/or direction from one device to another. In other words, wireless sensing may be used to determine relative position of wireless devices (e.g., wireless devices 103 and/or 105).

For example, two wireless devices (e.g., wireless devices 103 and/or 105) may engage in a sensing operation so that at least one of the wireless devices will be able to determine or estimate the relative direction (e.g., AOA) between the two devices, e.g., by determining the direction of a signal received from the other device.

Some wireless standards (e.g., 802.11ad/ay) may incorporate 60 GHz (e.g., millimeter wave or mmWave) communications and sensing, and may thus enable multi-element antennas in a small form factor. One exemplary benefit of such a multi-element antenna array is enabling high accuracy in estimating AOA (e.g., the direction of propagation of a radio frequency (RF) wave that is incident on the antenna array).

In some embodiments, sensing may be performed by a single wireless device (e.g., wireless device 103 or 105). In other words, sensing may be performed without wireless communication with a second device (e.g., without a wireless link). For example, a wireless device may transmit one or more signals and may monitor for and receive any number of echoes of the signal(s). The wireless device may determine the time of arrival and/or AOA of any or all such echoes. Based on the time of arrival and/or AOA, the wireless device may characterize its surroundings. For example, the wireless device may determine distance (e.g., based on time of flight) or direction to one or more objects, walls, etc. In other words, the wireless device may estimate the distance to an object, wall, etc. based on the time of flight from transmission of the signal to the reception of an echo. Similarly, the wireless device may determine direction based on AOA of an echo. The wireless device may combine these techniques to characterize or map its surroundings.

Figure 9A:
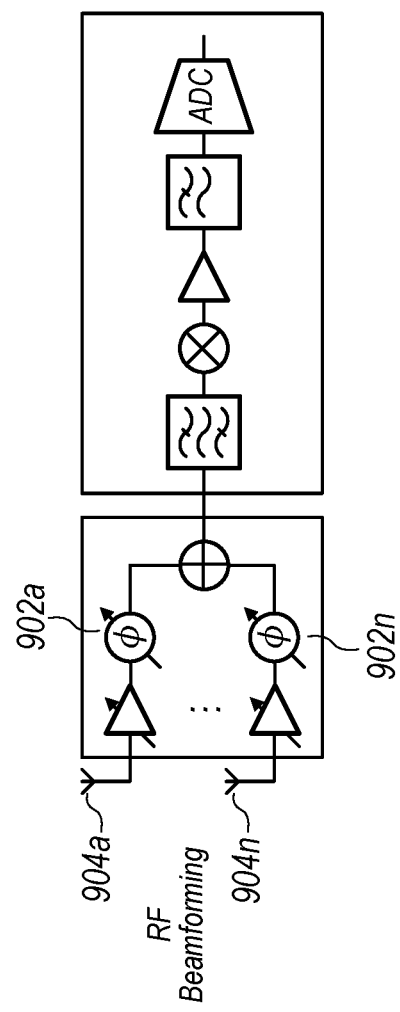
FIGS. 9A-9C are block diagrams illustrating exemplary configurations of receiver array circuitry, according to some embodiments.
Figure 9C:
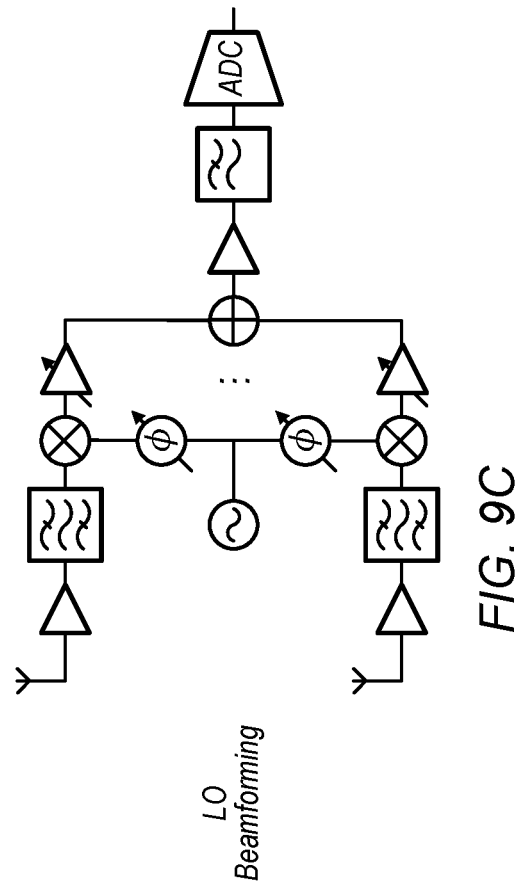
Figure 9B:
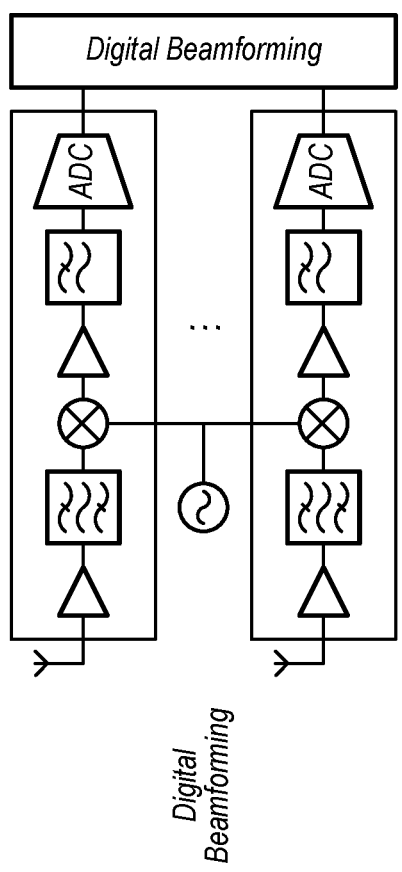

FIGS. 9A-9C—Exemplary Antenna Array Design

FIGS. 9A-9C illustrate exemplary antenna array circuitry, according to some embodiments. Three exemplary designs are shown.

In the case of an RF (e.g., analog) beamforming design (FIG. 9A), phase shifters (902a-902n), each corresponding to respective antenna (904a-904n), may be applied prior to adding signals received by multiple antennas. Any number of antennas (e.g., n) and corresponding phase shifters may be included. In some embodiments, all signals (e.g., the signals received by each of the respective n antennas) may be converted to digital by a single mixer, base-band route, and analog-digital converter (ADC). In other words, in at least some embodiments, phase shifting may occur in the RF. The combined signal of the various antennas may be mixed down in baseband processing after summation. The phase shifters 902 may be calibrated according to the techniques described herein. In some embodiments, the architecture of FIG. 9A may include or allow for: spatial interference cancellation prior to the receiver, variable TTD (e.g., instead of or in addition to variable phase shifting), support for wideband signals, and adding a beam former to an existing receiver.

In the case of digital beamforming design (FIG. 9B), each antenna may correspond to an individual respective ADC. Accordingly, in at least some embodiments, mixing may occur in the digital domain.

Having an ADC for each antenna element (as illustrated in FIG. 9B) may provide some advantages (e.g., support of MIMO, reception of different information from various angles, etc.). However, for wide-band signals, having an ADC for each antenna may impose high power costs and require significant amounts of space. Accordingly, in practical applications, smaller numbers of ADCs (e.g., a single ADC as in FIG. 9A) may be preferred, according to some embodiments.

In the case of local oscillator (LO) beamforming (FIG. 9C), variable phase shifters may be included in the LO path. In some embodiments, LO path oscillators may be effective with more relaxed requirements than RF path oscillators. The shifted LO signal may be combined with the signal from each of the receiving antennas, and may be amplified prior to a single ADC. However, LO routing may be difficult for large arrays.

In various embodiments, the calibration techniques (e.g., and/or portions thereof) described herein may also be applicable to various forms of beamforming, e.g., as illustrated in FIGS. 9A-9C, among various possibilities.

Figure 10:
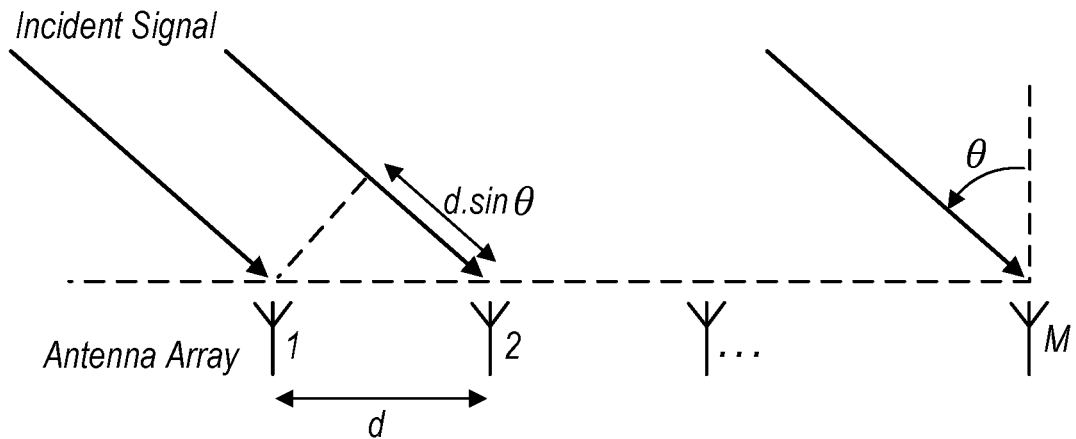
FIGS. 10 and 11 illustrate angle-of-arrival at an antenna array, according to some embodiments.
Figure 11:
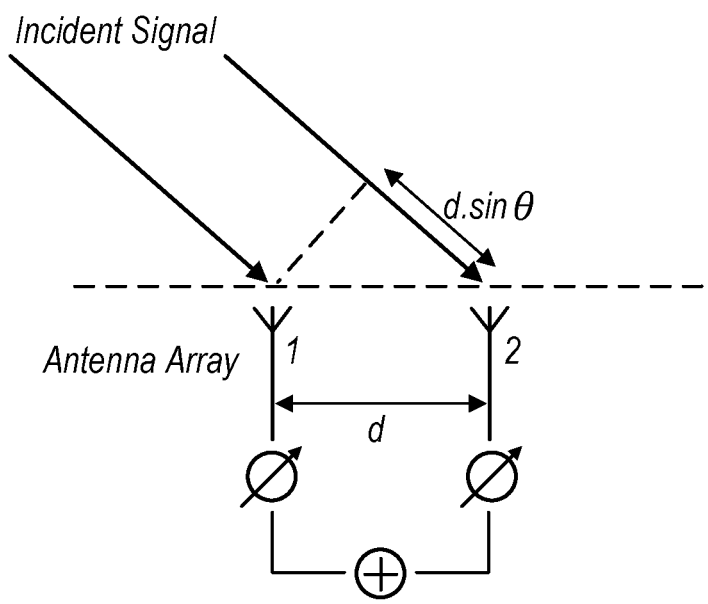

FIGS. 10 and 11—Angle of Arrival (AOA)

FIG. 10 illustrates AOA of an incident signal at an antenna array of M antenna elements. As shown, the distance between two of the antennas (e.g., antennas 1 and 2) may be denoted as d. The angle of incidence (measured from the axis of the antenna) may be denoted as Θ and may be estimated using the phase difference between the antennas. The phase difference may correspond to the distance d*sin(Θ). Deciphering the phase differences between antenna elements in the case of RF beamforming architecture may require orthogonal reception, according to some embodiments.

FIG. 11 further illustrates the AOA, including exemplary analog signal processing using RF beamforming, according to some embodiments. In particular, the signals of the antenna elements of the array may be phase shifted (e.g., using the calibration techniques disclosed herein) in the analog domain prior to summation and ADC.

Figure 12:
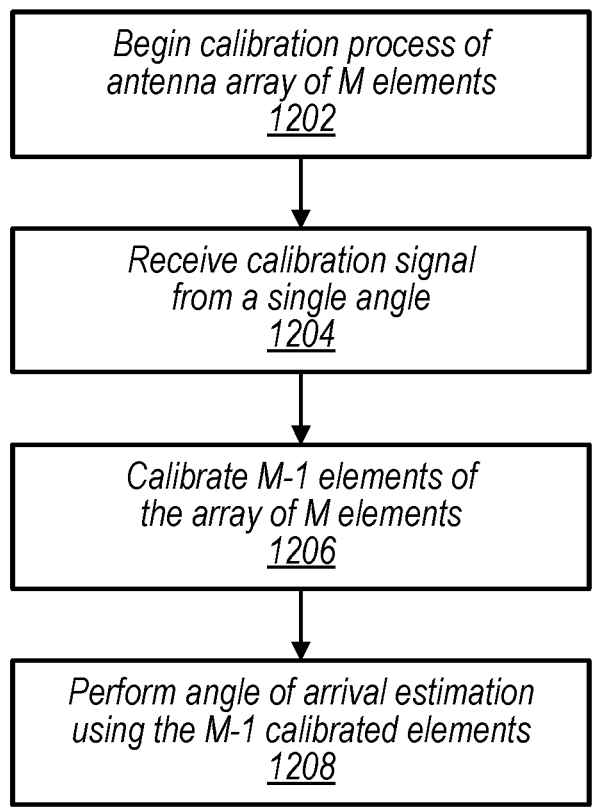
FIG. 12 is a flow chart diagram illustrating an example method for performing calibration of a phased array, according to some embodiments.

FIG. 12—Phased Antenna Array with Analog Beamforming Calibration Technique

As noted above, in order to determine the phase difference between an incident signal between two receiving antennas, orthogonal reception may be used, according to some embodiments. Orthogonal reception techniques include time division duplexing (TDD), e.g., turning ON and receiving with one antenna element at a time, and phase coding, e.g., receiving with all antenna elements, and sequentially using different phase shifter configurations. Exemplary advantages (e.g., pros) and disadvantages (e.g., cons) of these techniques are summarized in the following table:

|  | Pros | Cons |
| --- | --- | --- |
| TDD | Simple calibration | 'Slow' measurement (low noise amplifier (LNA) ON/OFF settling time) |
| Coding | 'Fast' measurement (PS settling time) | Complex calibration |

In TDD, each element of the array may receive separately (e.g., at different times, so that one antenna may be active at any given time during the measurement process). Accordingly, the time to measure an AOA may be slow, e.g., it may increase with the number of antennas and with the amount of time needed to switch between active antennas. The time required to switch between to antennas may be limited by the amount of time needed to power off one low noise amplifier (LNA) and turn on another LNA.

In contrast to TDD, phase coding may offer a faster measurement time (e.g., on the order of picoseconds (ps) based on the settling time of phase shifter reconfiguration), according to some embodiments. However, imperfections of and differences between the antenna elements (e.g., mainly due to mutual coupling) and the analog modules incorporated in the route from each element to the ADC may induce an estimation error. Accordingly, it may be desirable to estimate and apply a compensation prior to AOA estimation. In other words, calibrating the phase shifters may result in significantly more accurate AOA estimation. However, such calibration techniques may be complex. For example, full calibration of an array of M antenna elements with RF beamforming architecture may require M calibration targets, e.g., signals transmitted from M known directions. For large arrays, such calibration may be prohibitive.

Accordingly, improved methods for calibration of for AOA estimation may be desired. For example, improved methods to correct for the amplitude and phase differences induced through the route from the different antenna elements till the output of the combiner may be beneficial in devices using RF beamforming. FIG. 12 illustrates exemplary techniques for phased array (e.g., Hadamard) coding calibration for AOA estimation. Aspects of the method of FIG. 12 may be implemented by a wireless device, such as the wireless devices 103 and 105 as illustrated in and described with respect to the Figures, or more generally in conjunction with any of the computer systems or devices shown in the Figures, among other circuitry, systems, devices, elements, or components shown in the Figures, among other devices, as desired. For example, one or more processors (or processing elements) (e.g., processor(s) 302, 404, 512, 522, baseband processor(s), processor(s) associated with communication circuitry, etc., among various possibilities) may cause a wireless device to perform some or all of the illustrated method elements. Note that while at least some elements of the method are described in a manner relating to the use of communication techniques and/or features associated with 802.11 specification documents, such description is not intended to be limiting to the disclosure, and aspects of the method may be used in any suitable wireless communication and/or sensing system, as desired. In various embodiments, some of the elements of the methods shown may be performed concurrently, in a different order than shown, may be substituted for by other method elements, or may be omitted. Additional method elements may also be performed as desired. As shown, the method may operate as follows.

A wireless device 103 (e.g., a wireless device of any type including an array of multiple antennas) may begin a calibration process for an array of M antennas (1202). It will be appreciated that the wireless device 103 may have more than one array of antennas, each array of antennas may have any number of antennas. For example, an array of antennas may have M antennas where M is 4, 8, 16, 32, 64, 128, etc. Further, in embodiments where the wireless device 103 has multiple arrays of antennas, any number of the arrays may be calibrated in sequence and/or in a concurrent or overlapping manner.

The calibration process may be a production calibration (e.g., in a factory, e.g., at the time of production of the wireless device 103), a setup calibration (e.g., by a user or installer of the wireless device 103, e.g., at the time of purchase, installation, first use, etc.), or a real-time calibration (e.g., at any time during the operation or useful life of the wireless device 103), among various possibilities.

The wireless device 103 may exchange any number of messages with a second wireless device 105 (or any number of wireless devices 105) to coordinate and/or initiate the calibration. (It will be appreciated that the roles attributed to wireless devices 103 and 105 as used in this description are exemplary only; for example, the roles of the two devices may be reversed.) In some embodiments, the devices 103 and 105 may exchange one or more measurement negotiation messages or frames to determine parameters of the calibration such as timing, frequency, carrier frequency offset, transmit power, signal structure (e.g., the calibration signal may include one or more known sequences and the identity of or key to generating such sequences may be determined), number of times the signal may be transmitted, etc.

In some embodiments, the wireless device 103 may determine or estimate the direction to (e.g., from) the wireless device(s) 105. In other words, the wireless device 103 may determine an expected or known AOA of a signal (e.g., a calibration signal) from wireless device 103.

For example, in some embodiments, the wireless devices may exchange information that may be used to determine or estimate the direction between the devices (e.g., and thus AOA). For example, the wireless devices may exchange information about their respective locations.

In some embodiments, the wireless device 103 may use one or more sensors to determine the direction of the wireless device(s) 105. For example, the wireless device may use a location sensor (e.g., GPS), accelerometer, motion sensor, gyroscope, etc. to estimate its relative position. Alternatively, the wireless device 103 may receive information about the relative position or location from a user or from another device. It will be appreciated that such estimation may occur at any time.

The wireless device 103 may receive a calibration signal from wireless device 105 (1204). The calibration signal may be received with the array of antennas (e.g., possibly including all antennas of the array) to be calibrated and may be received from a single direction (e.g., transmitted from the wireless device 105).

In some embodiments, the calibration signal may be received at least M (e.g., the number of antenna elements) times. Each time that the calibration signal is received, the wireless device 103 may use a different configuration of phase shifters. For example, for each time the calibration signal is received, the wireless device may adjust one or more phase shifters to rotate the phase of one or more antennas of the array. For example, the phase of at least one antenna may be changed by 180 degrees for each reception of the M receptions of the signal. Each time the signal is received (and each corresponding configuration of phase shifters) may be associated with a different orthogonal Hadamard matrix row. Note that the direction from which the calibration signal is received may be constant (e.g., unchanged over the M times the signal is received).

It should be noted that the wireless device may receive the calibration signal in a multipath manner. In other words, the wireless device 103 may receive the signal in a line of sight (LOS) path from the wireless device 105 and/or in one or more non-LOS (NLOS) paths from the wireless device 105, according to some embodiments. For purposes of calibration, a single path may be used or preferred, according to some embodiments. For example, for calibration an LOS path or a first arrival path (FAP) (e.g., based on a time of arrival of the calibration signal) may be used, among various possibilities. For example, the wireless device 103 may receive the signal over multiple paths, and may filter out or otherwise ignore paths other than a FAP path for purposes of the calibration. Other measurements, (e.g., signal strength) may additionally or alternatively be used, according to some embodiments.

In some embodiments, the direction (e.g., angle) from which the calibration signal is received may be known, e.g., based on information exchanged prior to or during the calibration process and/or based on other determination of the relative position (e.g., based on sensors or received information). Further, expected signal characteristics may be determined based on the known angle and/or other characteristics of the expected signal (e.g., one or more sequences that may be included in the expected calibration signal).

In some embodiments, calibration signals may be received from multiple known angles.

The wireless device 103 may calibrate M−1 of the elements of the array of antennas to be calibrated (1206). The calibration may be based on the received calibration signal, e.g., based on the calibration signal from a single known angle-of-arrival. For example, based on knowledge of the expected angle (e.g., based on one or more other sensors and/or received information) and expected content (e.g., one or more known sequences and possibly parameters such as carrier frequency offset, etc.) of the calibration signal, the wireless device 103 may compare the received signal to an expected signal. In other words, the wireless device 103 may incorporate the known or assumed angle-of-arrival of the calibration signal in order to generate a steering matrix and use it together with the measured phase differences between antenna elements for calibration. For example, the phase and/or gain impairments associated to the different antenna elements of the array may be determined based on a comparison of a measured phase difference between antenna elements induced by the calibration signal to the expected phase differences between elements due to the angle-of-arrival of the impinging calibration signal as in FIG. 10. For example, an impairment and corresponding adjustment (e.g., a phase adjustment and/or gain adjustment) may be determined for each respective antenna of M−1 antennas of the M total antennas of the antenna array. In other words, one antenna of the M total antennas may not be calibrated. This Mth uncalibrated antenna may be treated as uncalibrated, set to zero, or otherwise not used for future AOA estimates. In some embodiments, leaving the Mth antenna uncalibrated may advantageously expedite the calibration process.

In some embodiments, the calibration may be a real-time calibration, e.g., while the wireless device 103 is in use, or a set-up calibration, e.g., while the wireless device 103 is installed or set-up. The wireless device 103 may determine, e.g., based on one or more sensors of wireless device 103 and/or information received from the wireless device 105, an expected angle of arrival (and possibly other expected signal characteristics) of the calibration signal.

In some embodiments, the calibration may be a manufacturing calibration, e.g., during the production process of wireless device 103. The wireless device 103 may receive information about the expected signal characteristics (e.g., including angle of arrival) of the calibration signal, e.g., from a signal generation device such as wireless device 105.

Expected signal characteristics at each antenna-element of the antenna array at a specific angle-of-arrival may be compared to actual, received signal characteristics at each antenna-element in order to calibrate individual antennas of the antenna array.

In some embodiments, the phase shifters of each antenna of the M−1 antennas may be adjusted based on the estimated phase corrections. Similarly, low noise amplifiers or other analog circuitry associated with each antenna of the M−1 antennas may be adjusted based on the estimated gain corrections. In other words, the wireless device 103 may build a compensation matrix of the corrections, and may apply the compensation matrix to adjust the settings of various receive circuitry components.

As explained in further detail below, the impairment and corresponding adjustments for the M−1 antennas may be calculated or estimated by applying an inverse Hadamard matrix on the received signal. Accordingly, all but one (e.g., M−1) of the M antennas may be calibrated using a single calibration signal (e.g., a single known or reference angle). Thus, this calibration process may allow the wireless device 103 to use phase coding for future AOA estimates (and thus enjoy the relatively fast (~ps) measurement times) without relying on a complex calibration process using calibration signals from M directions. For arrays with significant numbers of antennas (e.g., more than three antenna elements), the AOA may still be determined with a high degree of accuracy (e.g., and precision) despite leaving one antenna uncalibrated. It will be appreciated that the number of antennas and channel characteristics (e.g., SNR) may each impact accuracy of AOA estimates, according to some embodiments.

The wireless device 103 may estimate AOA of an incident signal using the M−1 calibrated elements of the array, according to some embodiments (1208). The Mth (e.g., uncalibrated) antenna may not be used or may be treated as uncalibrated. The incident signal may be received from the wireless device 105 or from any other device. The incident signal may be an echo of a signal transmitted by wireless device 103.

FIG. 13—Hadamard Coding for 2 Antennas

FIG. 13 illustrates Hadamard coding of two antenna elements, according to some embodiments. Assuming a known signal arriving from angle Θ, the illustrated coding may be based on two measurements, e.g., two orthogonal rows in the Hadamard matrix. A first row of the matrix, e.g., corresponding to a first reception of a calibration signal, may correspond to a phase shifter configuration with no phase-shifting (e.g., [1 1]). A second row (e.g., corresponding to a second reception of the calibration signal) may represent an additional measurement with one of the two phase shifters to have a 180° shift (or [1 −1]). This coding may enable determination of the actual phase difference between the two antenna elements, and therefore to estimate the angle of arrival Θ. In some embodiments, other orthogonal basis of size M (number of elements) may be used in order to code the phased shifters for M receptions, and based on them to decipher the phase difference between the elements.

The term y may represent the received signal (e.g., after combination of the two antennas, see, e.g., the system illustrated in FIG. 11). The received signal, y, may be equal to a Hadamard matrix (e.g., of the phase shift between the antennas, as described above) multiplied by a vector of the signals (a) received by each of the antennas. The impairment of the second antenna element may be in the phase diversion from the exact 180° and in additional gain relative to the first element. Note that the indeterminate (e.g., imaginary unit) number, shown here as j, is sometimes referred to as i. Wavelength is given by λ.

It will be appreciated that FIG. 13 illustrates a simplified example, e.g., with no gain or phase differences between the antennas and without any noise. In other words, the phase rotation is exactly 180 degrees. Such that, the illustrated phase coding may be decoded by the inverse Hadamard matrix, and the angle-of-arrival Θ may be estimated without an error by estimating the phase difference between antenna elements.

FIG. 14—Hadamard Coding for 4 Antennas

FIG. 14 illustrates Hadamard coding of four antenna elements, according to some embodiments. In this case, the received signal, a (1403), for each antenna is modified or impaired based on the interaction of the signal with the channel. Here, $y_0$ is the received signal based on four received Hadamard matrix rows received from a single calibration signal (e.g., a single angle/direction given by $\Theta_0$). As discussed above, the imperfections of and differences between the antenna elements (e.g., due to mutual coupling, etc.) and the analog modules incorporated in the route from each element to the ADC may induce estimation error. Therefore, it may be desirable to estimate and apply a compensation prior to AOA estimation. In the case of four elements, for example, this would require estimation of 7 impairment parameters (e.g., or more generally, 2M−1 parameters for M elements). The impairment parameters are the relative gain of the antennas (e.g., $\alpha_0$-$\alpha_3$) shown in diagonal matrix 1402 and the phase differences (e.g., $\varphi_1$-$\varphi_3$) shown in matrix 1401. Each row of matrix 1401 may correspond to an orthogonal reception of the calibration signal. The gain difference and phase difference between any two antennas may be result from any imperfections of the antennas and other circuitry in route to the ADC which may induce estimation error. Hadamard full calibration in the illustrated case of M=4 antenna elements may require calibration signals (e.g., targets) from M=4 different angles, e.g., $\{\Theta_0, \Theta_1, \Theta_2, \Theta_3\}$ and calculation of $\{y_0, y_1, y_2, y_3\}$ may be required for full calibration.

It will be appreciated that the illustrated example may use a one-dimensional array for simplicity, however the techniques described herein may be readily applied to arrays with two (or three) dimensions, according to some embodiments. For example, a two-dimensional array may determine AOA in a spherical coordinate system (e.g., using angles Θ and φ to represent the azimuthal and polar angles).

FIG. 15—Calibration Using a Single Target

FIG. 15 illustrates an approach for calibrating M−1 antenna elements using a single calibration target (e.g., a single calibration signal from a single direction), according to some embodiments. The remaining element, e.g., the Mth element may be zeroed or used as uncalibrated for subsequent AOA estimation. FIG. 15 illustrates an array of M=4 antennas as in FIG. 14.

As illustrated, by applying an inverse Hadamard matrix (e.g., $H_d^{-1}$) to the received signal (e.g., $y_0$), the impairment of all elements, other than the first element, do not depend on the other elements. Thus, it is possible to estimate these unknown impairments (and therefore compensate for the respective impairments and calibrate the respective phase shifters of the respective antennas) with only a single calibration target. In other words, referring to the bottom portion of the illustrated equation, the top row (e.g., corresponding to a first antenna, e.g., antenna 0) of the left-hand matrix includes non-zero coefficients corresponding to $\alpha_0$-$\alpha_3$ and $\varphi_1$-$\varphi_3$ in the right-hand matrix. Thus, the impairment of the first antenna element 0 (e.g., corresponding to the top row) depends on each of the other antenna elements (e.g., 1-3) and would therefore require additional calibration targets to estimate. Each of the bottom three rows (e.g., corresponding to antenna elements 1-3) of the left-hand matrix, however, only has one non-zero coefficient corresponding to a single value of α and φ (e.g., $\alpha_1$ and $\varphi_1$, in the case of the second row, corresponding to antenna element 1). These non-zero coefficients are highlighted by box 1502 and the corresponding impairments in the right-hand matrix are highlighted by box 1504. Thus, the corresponding gain and phase adjustments for each antenna (e.g., for antennas 1-3)

may be determined based on the received signal $y_0$ from a single known direction (e.g., in one-dimension, the known angle may be depicted by the angle $\Theta_0$, however it will be appreciated that a two-dimensional application using angle $\Theta_0$, $\varphi_0$, may be determined similarly). For example, based on knowledge of the angle $\Theta_0$ and the content of the calibration signal, the wireless device (e.g., wireless device 103) may compare the received signal $y_0$ to an expected signal. For each antenna 1-3, the wireless device may calculate a gain adjustment and phase shift to apply to the respective antenna for future AOA estimates. For example, the wireless device may compare or normalize the antenna elements, e.g. $\alpha_2(1+e^{j\varphi_2})/[\alpha_1(1+e^{j\varphi_1})]$ to determine relative impairments. Thus, all of the elements may be calibrated relative to a single antenna element, according to some embodiments.

It will be appreciated that any angle $\Theta_0$ may be used for the calibration. Further, a single target or known angle (e.g., $\Theta_0$) may be used to calibrate M−1 antennas of an array of M antennas, even for arbitrarily large values of M. For example, large antenna arrays, e.g., with more than 16 antennas, may be calibrated as shown. Large arrays calibrated according to these techniques may allow for high-accuracy AOA estimation.

FIGS. 16-19—Example of 8 Antenna Elements and Additional Information

FIGS. 16 and 17 illustrate application of an inverse Hadamard matrix to calibrate 7 elements of an array of M=8 antennas, according to some embodiments. FIG. 16 illustrates that the application of the inverse Hadamard matrix to received signal $y_0$ (e.g., the inverse may be referred to as $y'_0$) may be normalized by dividing the result of a single antenna (e.g., antenna 1, as shown) (1602). As highlighted by 1604, the impairment values for antennas 1-7 may not depend on other antennas. Accordingly, these 7 antennas may be calibrated using a single calibration angle, $\Theta_0$.

FIG. 17 illustrates the calculation for the 7 calibrated antennas (e.g., denoted by "1:7"). The wireless device may generate a steering matrix $A_0$ (1702) based on the direction of the calibration signal. As in FIG. 16, the values may be normalized using (e.g., divided by) the impairment of antenna 1 (for example, other antennas may be used as desired), so that the (e.g., normalized) value of antenna 1 is 1. The normalized values may be referred to as $y_0'$.

FIG. 18 illustrates that the techniques described herein allow for compensation of the impairment (e.g., the inverse of the diagonalization of the matrix of impairment, a) using a single calibration target. In other words, FIG. 18 illustrates the construction of a compensation matrix.

As shown in FIG. 19, the estimated gain impairment, a, (e.g., of M−1 antennas) may be determined by applying the inverse of the steering matrix $A_0$ to the received signal from a single calibration target (e.g., boresight) for the M−1 antennas.

Figure 20:
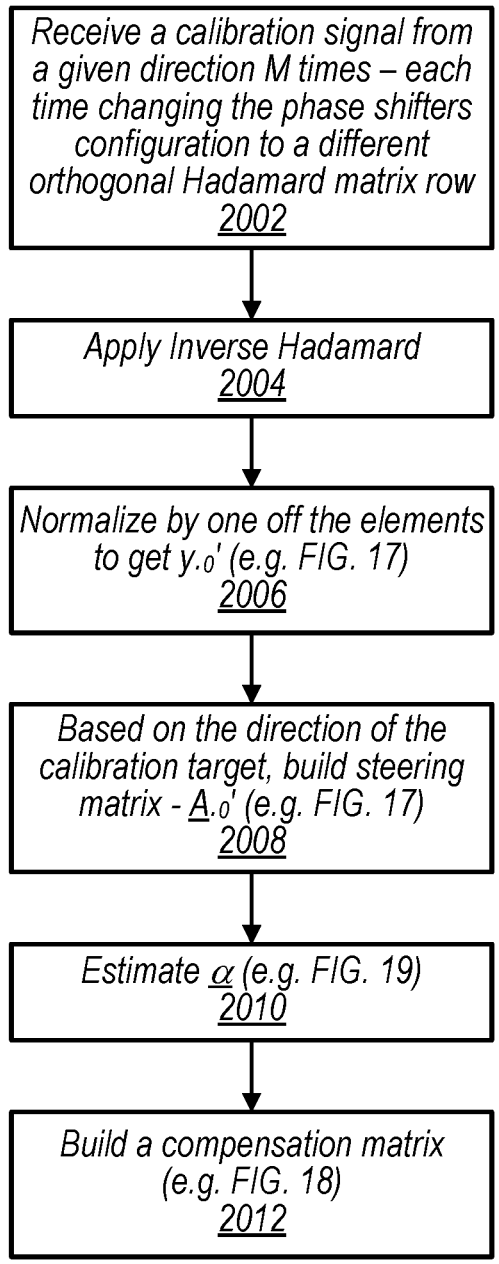
FIGS. 20 and 21 illustrate exemplary processes for calibration and compensation, according to some embodiments.
Figure 21:
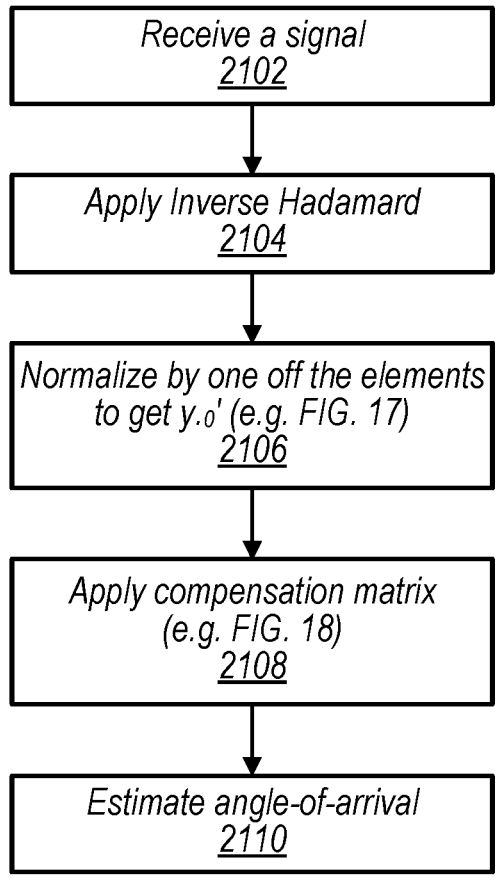

FIGS. 20 and 21—Example Calibration and Compensation Processes

FIG. 20 is a flow chart diagram illustrating an exemplary calibration process according to the techniques of FIG. 12, according to some embodiments. FIG. 20 may illustrate exemplary aspects of the techniques of FIG. 12 from the prospective of the wireless device 103. Note that while at least some elements of the method are described in a manner relating to the use of communication techniques and/or features associated with 802.11 specification documents, such description is not intended to be limiting to the disclosure, and aspects of the method may be used in any suitable wireless communication and/or sensing system, as desired.

In various embodiments, some of the elements of the methods shown may be performed concurrently, in a different order than shown, may be substituted for by other method elements, or may be omitted. Additional method elements may also be performed as desired. As shown, the exemplary process may proceed as follows.

The wireless device 103 may receive a calibration signal, e.g., from wireless device 105 (2002), according to some embodiments. The signal may be received M times, each time from the same angle. Each time that the wireless device 103 receives the calibration signal, it may adjust or change the phase of one or more phase shifters, thus configuring the phase shifters according to a different orthogonal Hadamard matrix row. In other words, the wireless device 103 may adjust the phase of one or more antennas by 180 degrees between each reception so that M orthogonal receptions are performed.

The wireless device 103 may apply an inverse Hadamard matrix (2004). In other words, the wireless device 103 may multiply the received signal $y_0$ by an inverse Hadamard matrix as illustrated in the top portion of FIG. 15, according to some embodiments.

The wireless device 103 may normalize the results by one of the elements (2006). This normalization may result in $y_0'$ as illustrated in FIG. 17, according to some embodiments.

Based on the direction of the calibration target (e.g., wireless device 105 or other source/direction of the calibration signal), the wireless device 103 may build a steering matrix (2008). The steering matrix may be similar to $A_0'$, e.g., as illustrated in FIG. 17, according to some embodiments.

The wireless device 103 may estimate the gain impairment, a (2010). This estimation may be determined as illustrated in FIG. 19, according to some embodiments.

The wireless device 103 may build a compensation matrix (2012). The compensation matrix may be constructed as illustrated in FIG. 18, according to some embodiments.

FIG. 21 is a flow chart diagram illustrating an exemplary compensation (e.g., AOA measurement) process according to the techniques of FIG. 12, according to some embodiments. FIG. 21 may illustrate exemplary aspects of the techniques of FIG. 12 from the prospective of the wireless device 103. Note that while at least some elements of the method are described in a manner relating to the use of communication techniques and/or features associated with 802.11 specification documents, such description is not intended to be limiting to the disclosure, and aspects of the method may be used in any suitable wireless communication and/or sensing system, as desired. In various embodiments, some of the elements of the methods shown may be performed concurrently, in a different order than shown, may be substituted for by other method elements, or may be omitted. Additional method elements may also be performed as desired. As shown, the exemplary process may proceed as follows.

The wireless device 103 may receive a signal (2102), according to some embodiments. The signal may be received from an unknown (e.g., to be determined) direction. The signal may be received from any source, e.g., from wireless device 105, or from any other device, among various possibilities.

In some embodiments, the signal may be received multiple times (e.g., M times). The wireless device 103 may adjust the configuration of the phase shifters for each of the M receptions, e.g., to correspond to a different orthogonal Hadamard matrix row for each reception. In other words, the wireless device 103 may adjust the phase of one or more antennas by 180 degrees between each reception so that M orthogonal receptions are performed.

The wireless device 103 may apply an inverse Hadamard matrix (2104). In other words, the wireless device 103 may multiply the received signal $y_0$ by an inverse Hadamard matrix as illustrated in the top portion of FIG. 15, according to some embodiments.

The wireless device 103 may normalize the results by one of the elements (2106). This normalization may result in $y_0'$ as illustrated in FIG. 17, according to some embodiments.

The wireless device 103 may apply the compensation matrix (2108), according to some embodiments. For example, the compensation matrix may be similar to the example of FIG. 18, among various possibilities. In other words, the wireless device may adjust the phase and/or gain of the signal received by the M−1 calibrated antennas according to the compensation matrix.

It will be appreciated that although, in the illustrated example, the compensation matrix is applied subsequent to reception of the signal, that various orders are possible. For example, the compensation matrix may be applied prior to receiving the signal, e.g., the settings of various amplifiers, phase shifters, etc., may be set based on the compensation matrix prior to receiving a signal (e.g., a signal for which AOA is to be estimated).

The wireless device 103 may estimate the AOA of the signal (2110), according to some embodiments. In other words, by applying the compensation matrix to the signal (e.g., as well as application of the inverse Hadamard matrix and normalization), the wireless device 103 may determine the phase differences of the received signal between the various antennas of the antenna array, and may thus determine the AOA of the received signal.

FIGS. 22-29—Calibration of M Antennas

Figure 22:
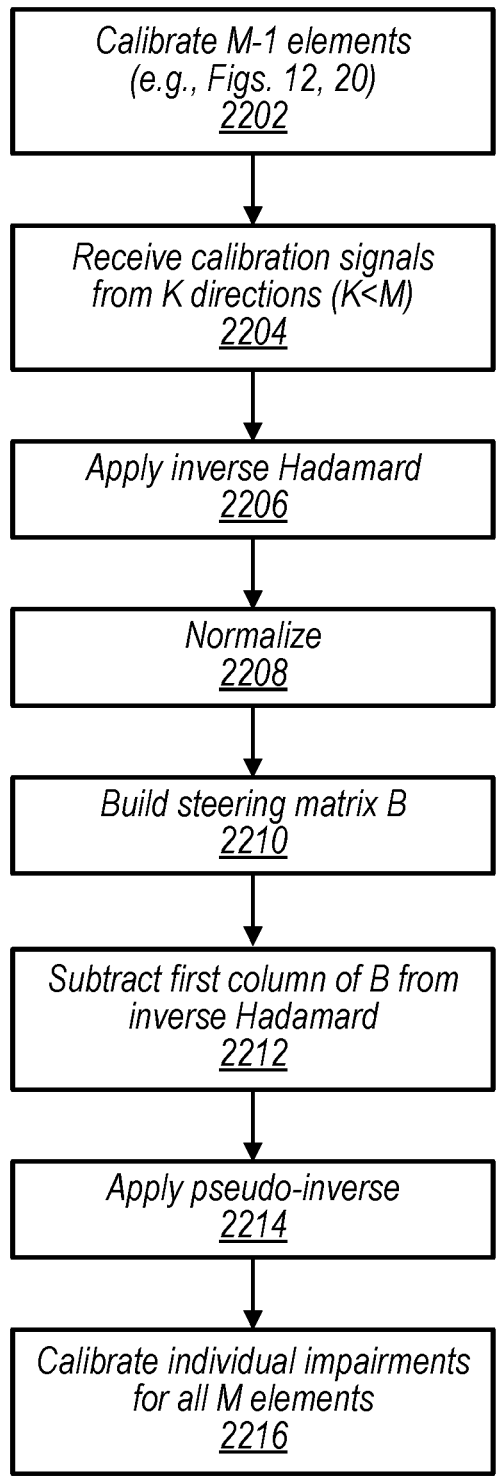

In some embodiments and/or circumstances, it may be desirable to perform a calibration process that calibrates all M antennas of an antenna array (e.g., a process that calibrates the last, e.g., Mth antenna, which may be left uncalibrated according to the techniques described above, e.g., with respect to FIGS. 12 and 20, etc.). However, as discussed above, performing full calibration of such an array may require calibration signals from M known directions (e.g., calibration targets). Thus, such a full calibration may be complicated and/or time consuming. FIG. 22 illustrates techniques for performing calibration of all M antennas using at least two, but fewer than M calibration targets. Accordingly, the techniques of FIG. 22 may provide improved calibration relative to the techniques of FIG. 12, without the complexity or time requirements of full calibration.

FIG. 22 is a flow chart diagram illustrating an exemplary calibration process for calibrating M antennas (e.g., for calibrating the Mth antenna), according to some embodiments. Note that techniques of FIG. 22 may be performed in conjunction with (e.g., before, after, and/or concurrently with) aspects of the techniques of FIGS. 12 and/or 20. Additionally, the techniques of FIG. 22 may be performed independently of the techniques of FIGS. 12 and/or 20. For example, a wireless device 103 may perform a calibration of M−1 antennas according to the techniques of FIGS. 12 and/or 20 at a first time and later (e.g., at a second time) perform a calibration of the Mth antenna (or all antennas) according to the techniques of FIG. 22. Alternatively, a wireless device may perform a calibration of all M antennas according to the techniques of FIG. 22 at a first time and later (e.g., at a second time) perform a calibration of the M−1 antennas (e.g., to maintain and/or improve relative calibration) according to the techniques of FIG. 12. A wireless device 103 may perform any or all of the disclosed calibration techniques (e.g., FIGS. 12, 20, and/or 22) at any time.

Aspects of the techniques of FIG. 22 may be performed by and described from the prospective of the wireless device 103. Note that while at least some elements of the method are described in a manner relating to the use of communication techniques and/or features associated with 802.11 specification documents, such description is not intended to be limiting to the disclosure, and aspects of the method may be used in any suitable wireless communication and/or sensing system, as desired. In various embodiments, some of the elements of the method shown may be performed concurrently, in a different order than shown, may be substituted for by other method elements, or may be omitted. Additional method elements may also be performed as desired. As shown, the exemplary process may proceed as follows.

The wireless device 103 may perform a calibration process of an antenna array of M antenna elements (2202), according to some embodiments. For example, the wireless device 103 may calibrate M−1 antennas as discussed above regarding FIGS. 12 and/or 20. It will be appreciated that this initial calibration of M−1 antennas is optional. In other words, a wireless device 103 may simply begin a calibration process, without performing a previous calibration (e.g., as discussed with respect to 1202).

The wireless device 103 may receive calibration signals from K known directions (e.g., boresights) (2204), according to some embodiments. K may be greater than 1 and less than M, according to some embodiments. For example, K may range from 2-4, among various possibilities. Thus, the received calibration signals may not be sufficient for full calibration according to conventional techniques. The calibration signals may be received from one or more wireless devices 105. For example, the calibration signals may be received from one or more wireless device(s) 105 during a production and/or calibration process, e.g., in a manufacturing, calibration, or testing facility, etc.

In some embodiments, the wireless device 103 may receive calibration signals M times from each of the K directions, and may change the phase shifters' configuration to a different orthogonal Hadamard matrix row for each time of the M receptions. This changing of configurations may be similar to that described with respect to 2002. In other words, the wireless device may receive a total of M*K signals, e.g., K sets of M expected signals, such that each set of signals generates M different orthogonal receptions.

The wireless device 103 may apply an inverse Hadamard (2206), according to some embodiments. This application may be similar to that described with respect to 2004.

The wireless device 103 may normalize the elements (2208), according to some embodiments. This normalization may be similar to that described with respect to 2006.

The wireless device 103 may build a steering matrix, B, based on the directions of the K calibration targets (2210), according to some embodiments. This steering matrix may be similar to that described above with respect to 2008 and FIG. 17. Various features of steering matrix B are discussed below with respect to FIGS. 23 and 24.

The wireless device 103 may modify the impairment vector α by subtracting the first column of steering matrix B from the inverse Hadamard of the received signals (2212), according to some embodiments. This modification is discussed below with respect to FIG. 24.

The wireless device 103 may apply a pseudo-inverse of the normalized, inverse Hadamard matrix y' (2214), according to some embodiments. In other words, the wireless device may generate an approximate impairment vector $\alpha''$ based on the pseudo-inverse of the steering matrix, e.g., $B^+$ as shown in FIG. 25 and discussed below.

The wireless device 103 may determine individual impairments and may calibrate all M antennas (2216), according to some embodiments. For example, using the approximate impairment vector $\alpha''$, the wireless device may determine each impairment of all M antenna elements. In other words, the wireless device 103 may estimate values of $\alpha$ and $\varphi$ for each antenna element and may apply adjustments to amplifiers and/or phase shifters to compensate for the impairments.

The wireless device 103 may use the calibrated antenna array to determine AOA of incident signals. All M antennas may be used, e.g., without discarding or setting any values to zero.

FIG. 23 illustrates the application of inverse Hadamard to the received calibration signals (e.g., y') to generate steering matrix B, according to some embodiments. As shown, y' may consist of a combination or concatenation of K matrices, $y'_0$-$y'_K$, and each respective matrix may correspond to the calibration signals received from a respective (e.g., kth) direction of the K directions. Each of the matrices may represent the signals received (from the respective, e.g., kth direction) using each of the M orthogonal configurations of the phase shifters.

y' may be equal to steering matrix B multiplied by the inverse of the impairment vector $\alpha$, e.g., $\alpha'$. In the case that K<M, steering matrix B may be underestimated (e.g., K entries in y' and corresponding dimension of B may be insufficient to solve for the M different values of $\alpha$ and $\varphi$ in the inverse impairment vector, $\alpha'$). The Moore-Penrose pseudo-inverse may lead to one of an infinite number of solutions (e.g., sets of values of a and $\varphi$ that solve the equation). However, the pseudo-inverse solution may be the solution with the minimum norm. Accordingly, in the case that the phase deviation from 180° is small (which may be typical in the design and calibration of antenna arrays), the actual norm may be small under some circumstances. For example, when $\alpha_0 \approx \alpha_1$, then the $\alpha'$ may be modified by subtracting the first column of B from the y' vector, as shown in FIG. 24. In other words, the first column of B may be subtracted from both sides of the equation of FIG. 23.

FIG. 24 illustrates the result of subtracting the first column of B from the y' vector which may be referred to as y'', according to some embodiments. This subtraction increases the probability that the pseudo-inverse is sufficiently close to the actual impairments vector, $\alpha$.

FIG. 25 illustrates a calculation of an approximate impairment vector $\alpha''$ based on the Moore-Penrose pseudo-inverse of B, e.g., $B^+$, according to some embodiments. $\alpha''$ may provide estimates of the upper and lower parts of the $\alpha$ vector.

FIG. 26 illustrates a compensation matrix for all M antenna elements, according to some embodiments. The compensation matrix may be built based on the estimate of the $\alpha$ vector illustrated in FIG. 25. It will be appreciated, that although FIG. 26 is illustrated with mathematical symbols, numerical values of the coefficients may be determined.

FIGS. 27-29 illustrate an exemplary calculation of an individual impairment, according to some embodiments. As shown, FIGS. 27 and 28 correspond to two of the estimated coefficients of the compensation matrix, specifically the two non-zero coefficients of the third column. FIG. 29 illustrates that the relation between these two coefficients can be used to determine an individual impairment value, $\varphi_2$. $\varphi 2$ may represent the offset of the 2nd element phase shifter from 180 degrees (e.g., out of phase) at '−1' configuration in the Hadamard row. Similar determinations may be made for the other impairments, e.g., $\varphi_1$-$\varphi_{M-1}$ and $\alpha_1$-$\alpha_{M-1}$.

Figure 30:
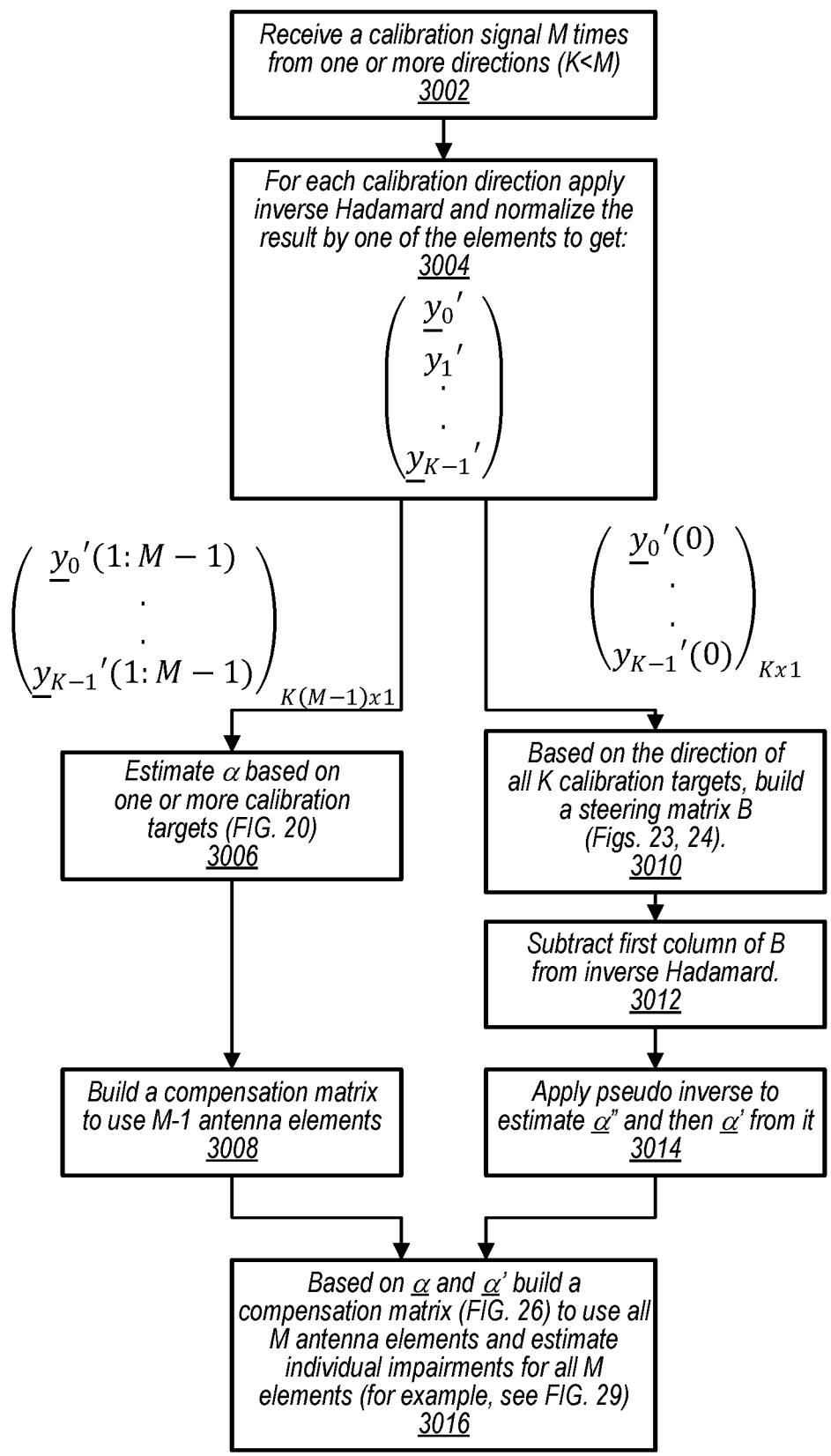
FIG. 30 is a flow chart diagram illustrating aspects of methods for calibrating one or more antennas, according to some embodiments.

FIG. 30—Calibration Techniques

FIG. 30 is a flow chart diagram illustrating an exemplary generalized calibration process for calibrating antennas, according to some embodiments. FIG. 30 illustrates aspects of the techniques of FIGS. 12, 20, and 22, according to some embodiments. According to the illustrated techniques, a wireless device 103 may calibrate some or all (e.g., up to M) antennas of an array using calibration signals from K directions (where K ranges from 1 to M).

Aspects of the techniques of FIG. 30 may be performed by and described from the prospective of the wireless device 103. Note that while at least some elements of the method are described in a manner relating to the use of communication techniques and/or features associated with 802.11 specification documents, such description is not intended to be limiting to the disclosure, and aspects of the method may be used in any suitable wireless communication and/or sensing system, as desired. In various embodiments, some of the elements of the method shown may be performed concurrently, in a different order than shown, may be substituted for by other method elements, or may be omitted. Additional method elements may also be performed as desired. As shown, the exemplary process may proceed as follows.

The wireless device 103 may receive calibration signals from K known directions (e.g., boresights) (3002), according to some embodiments. K may range from 1 to M, according to some embodiments. Thus, the received calibration signals may or may not be sufficient for full calibration according to conventional techniques. The wireless device 103 may receive calibration signals M times from each of the K directions and may adjust phase shifters to a different Hadamard matrix row for each reception. This changing of configurations may be similar to that described with respect to 2002. The calibration signals may be received from one or more wireless devices 105. For example, the calibration signals may be received from one or more wireless device(s) 105 during a production and/or calibration process, e.g., in a manufacturing, calibration, or testing facility, etc.

The wireless device 103 may apply an inverse Hadamard for each of the K calibration directions and normalize the result by one of the elements (3004), according to some embodiments. This application may be similar to that described with respect to 2004 and 2006.

In order to calibrate M−1 antenna elements, the wireless device 103 may proceed to estimate a using one or more (e.g., K) calibration targets (3006), according to some embodiments. For example, this estimation may be preformed according to the techniques of FIG. 20, e.g., as described in 2008 and 2010.

Proceeding from 3006, the wireless device 103 may build a compensation matrix (3008), according to some embodiments. The compensation matrix may be useful for calibrating M−1 antennas. For example, this estimation may be performed according to the techniques of FIG. 20, e.g., as described in 2012. The wireless device 103 may proceed to calibrate M−1 antennas and perform AOA estimation with the calibrated antennas.

In some embodiments, K>1 calibration targets may be used in 3006 and 3008. As noted, this may be similar to the method described regarding FIG. 20. However, the K targets may be weighted using least squares to account for different noise levels, e.g., of the different targets.

Returning to 3004, in order to calibrate M antenna elements (e.g., or calibrate the Mth antenna), the wireless device 103 may proceed to build a steering matrix B (3010), according to some embodiments. For example, the steering matrix B may be built as described above regarding 2210 and as illustrated in FIGS. 23 and 24.

Proceeding from 3010, the wireless device 103 may subtract the first column of B from the inverse Hadamard (3012), according to some embodiments. For example, this subtraction may be performed as described above with respect to 2212.

Proceeding from 3012, the wireless device 103 may apply the pseudo inverse to estimate a" and a' (3014), according to some embodiments. For example, this subtraction may be performed as described above with respect to 2214 and FIGS. 23-25.

The wireless device 103 may generate a compensation matrix to use all M antennas (3016), according to some embodiments. For example, the compensation matrix may be generated as described above regarding 2216 and FIG. 26. The wireless device may calculate individual impairments for all (e.g., M) antenna elements (see FIGS. 27-29).

Embodiments of the present disclosure may be realized in any of various forms. For example, some embodiments may be realized as a computer-implemented method, a computer-readable memory medium, or a computer system. Other embodiments may be realized using one or more custom-designed hardware devices such as ASICs. Still other embodiments may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a device (e.g., a UE) may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus for calibrating an antenna array of a wireless device, wherein the antenna array includes M antennas, and wherein the apparatus includes:
   a processor, configured to cause the wireless device to:
      begin a calibration process of the antenna array with a second wireless device;
      determine an expected angle-of-arrival of a calibration signal from the second wireless device;
      receive, from the second wireless device, the calibration signal from a single angle;
      calibrate, based on the calibration signal and the expected angle-of-arrival, M−1 antennas of the antenna array; and
      perform, using the M−1 antennas of the antenna array, an angle-of-arrival estimate of a wireless signal.

2. The apparatus of claim 1,
   wherein signals received via each respective antenna of the M antennas are summed in the analog domain.

3. The apparatus of claim 1,
   wherein the calibration signal is received M times, each respective time of the M times using a different configuration of phase shifters corresponding to a different orthogonal Hadamard matrix row.

4. The apparatus of claim 1,
   wherein to perform the angle-of-arrival estimate, an Mth antenna of the M antennas is left uncalibrated and/or zeroed.

5. The apparatus of claim 1,
   wherein to calibrate the M−1 antennas includes applying an inverse Hadamard matrix to the calibration signal, wherein the inverse Hadamard matrix is a punctured Hadamard matrix.

6. The apparatus of claim 1,
   wherein to calibrate the M−1 antennas includes estimating relative gains of the M−1 antennas.

7. The apparatus of claim 1,
   wherein to calibrate the M−1 antennas includes estimating relative phase corrections of the M−1 antennas.

8. A wireless device comprising:
   an array of M antennas; and
   a processor operably coupled to the array of M antennas and configured to cause the wireless device to:
      determine a known angle-of-arrival associated with a calibration target;
      receive a calibration signal from the calibration target;
      calibrate M−1 antennas of the M antennas based on the calibration signal and the known angle-of-arrival; and
      estimate an angle-of-arrival of an incident signal using the M−1 antennas.

9. The wireless device of claim 8,
   wherein the array of M antennas is a phased array with a radio frequency beamforming architecture.

10. The wireless device of claim 8,
    wherein the angle of arrival is estimated using phase coding.

11. The wireless device of claim 8,
    wherein M is greater than 16.

12. The wireless device of claim 8, further comprising:
    M phase shifters corresponding respectively to the M antennas, wherein calibrating the M−1 antennas includes determining respective phase adjustments for the M−1 antennas and adjusting M−1 respective phase shifters of the M−1 antennas.

13. The wireless device of claim 8, further comprising:
M amplifiers corresponding respectively to the M antennas.

14. The wireless device of claim 13,
wherein calibrating the M−1 antennas includes determining gain adjustments for the M−1 antennas and adjusting respective amplifiers of the M−1 antennas.

15. A method for calibrating antennas of an antenna array of a wireless device, the method comprising:
at the wireless device:
receiving, using an array of M antennas, M*K calibration signals from K known directions;
determining M*K expected signals;
calibrating, based on the M*K calibration signals, the M*K expected signals, and the K known directions, the M antennas; and
estimating an angle of arrival of a second signal using the M antennas.

16. The method of claim 15,
wherein K is greater than 1 and less than M.

17. The method of claim 15,
wherein said calibrating includes estimating respective $\alpha$ and $\varphi$ impairments for each respective antenna of the M antennas.

18. The method of claim 17, wherein said estimating includes generating an impairment vector using a pseudo-inverse steering matrix.

19. The method of claim 15, the method further comprising:
performing a calibration of M−1 of the M antennas, wherein said performing is prior to said receiving.

20. The method of claim 19,
wherein performing the calibration of M−1 of the M antennas includes determining gain adjustments for the M−1 antennas.

* * * * *